United States Patent [19]
Izumi

[11] Patent Number: 6,062,954
[45] Date of Patent: May 16, 2000

[54] SEMICONDUCTOR WAFER SURFACE FLATTENING APPARATUS

[75] Inventor: Shigeto Izumi, Ayase, Japan

[73] Assignee: Speedfam Co., Ltd., Ayase, Japan

[21] Appl. No.: 09/121,995

[22] Filed: Jul. 24, 1998

[30] Foreign Application Priority Data

Jan. 9, 1998 [JP] Japan ................................ 10-015005

[51] Int. Cl.$^7$ ..................................................... B24B 1/00
[52] U.S. Cl. ................................. 451/72; 451/57; 451/65; 451/285; 451/41; 451/287; 451/339
[58] Field of Search ................................. 451/41, 56, 57, 451/65, 72, 285, 287, 288, 289, 290, 339

[56] References Cited

U.S. PATENT DOCUMENTS

| | | | |
|---|---|---|---|
| 5,333,413 | 8/1994 | Hasimoto | 51/165.75 |
| 5,361,545 | 11/1994 | Nakamura | 451/287 |
| 5,562,524 | 10/1996 | Gill, Jr. | 451/1 |
| 5,649,854 | 7/1997 | Gill, Jr. | 451/290 |
| 5,679,055 | 10/1997 | Greene et al. | 451/10 |
| 5,816,891 | 10/1998 | Woo | 451/6 |
| 5,830,045 | 11/1998 | Togawa et al. | 451/288 |

FOREIGN PATENT DOCUMENTS

| | | |
|---|---|---|
| 0 774 323 | 5/1997 | European Pat. Off. . |
| 5-326468 | 12/1993 | Japan . |
| 7-297195 | 11/1995 | Japan . |
| 9-36071 | 2/1997 | Japan . |
| 9-36072 | 2/1997 | Japan . |
| 9-45642 | 2/1997 | Japan . |
| 9-45644 | 2/1997 | Japan . |
| 9-155728 | 6/1997 | Japan . |
| 10-98016 | 4/1998 | Japan . |
| 10-217112 | 8/1998 | Japan . |
| 10-230451 | 9/1998 | Japan . |

OTHER PUBLICATIONS

*Performance of the Applied Materials CMP Systems for Inter–Level Dielectric Polishing Processes Using Single Step and Multi–Step Sequences*, Tolles et al, 1996 CMP–MIC Conference, pp. 201–208.

Primary Examiner—Timothy V. Eley
Assistant Examiner—Dung Van Nguyen
Attorney, Agent, or Firm—Flynn, Thiel, Boutell & Tanis, P.C.

[57] ABSTRACT

A semiconductor wafer surface flattening apparatus achieves stable polish characteristics while maintaining a high throughput value and a small footprint. When an index table 22 rotates by a prescribed angle and indicates a rotation position, a first pre-polish semiconductor wafer is moved to a position near a first platen 23. First through third platens 23 through 25 are installed around the index table 22. First through third carriers 46 through 48 are installed for the platens 23 through 25. One of the carriers 46 through 48 is positioned above each of the platens, respectively. The first carrier above the first platen holds and transports the first pre-polish semiconductor wafer. Then the first pre-polish semiconductor wafer is polished. While the first semiconductor wafer is being polished, a second pre-polish semiconductor wafer is supplied to the index table 22. When the index table 22 rotates by the prescribed angle and indicates another rotation position, the second pre-polish semiconductor wafer is moved to a position near the second platen. After this, the second carrier positioned above the second pre-polish semiconductor wafer picks up, holds, and transports the second pre-polish semiconductor wafer to the second platen. Then the second pre-polish semiconductor wafer is polished. In this way, multiple semiconductor wafers are sequentially polished.

17 Claims, 15 Drawing Sheets

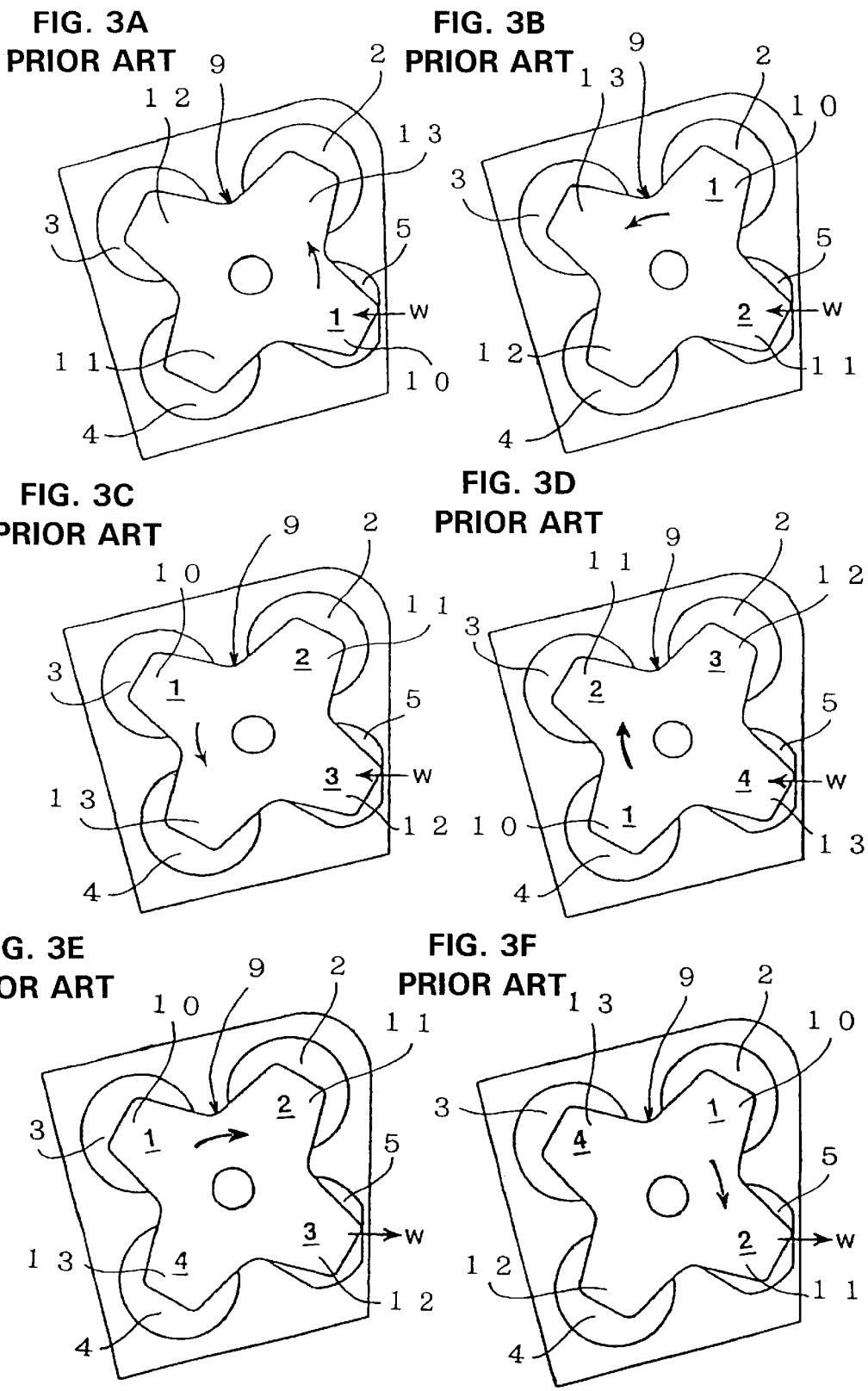

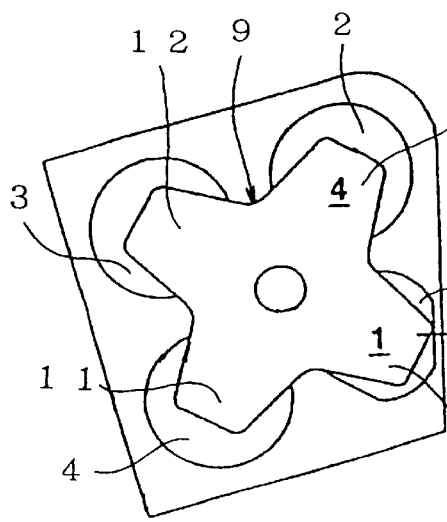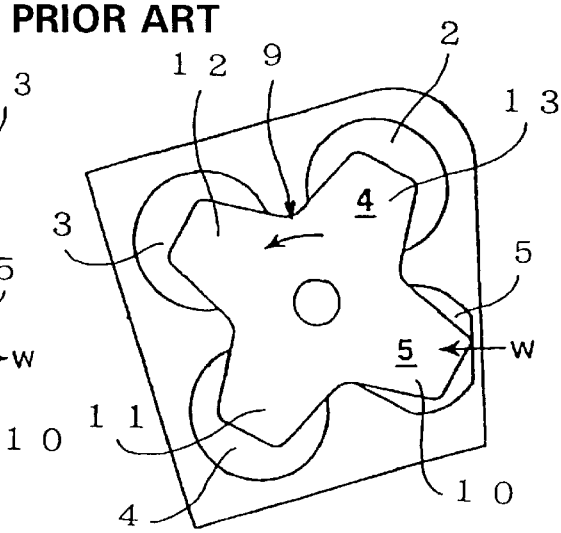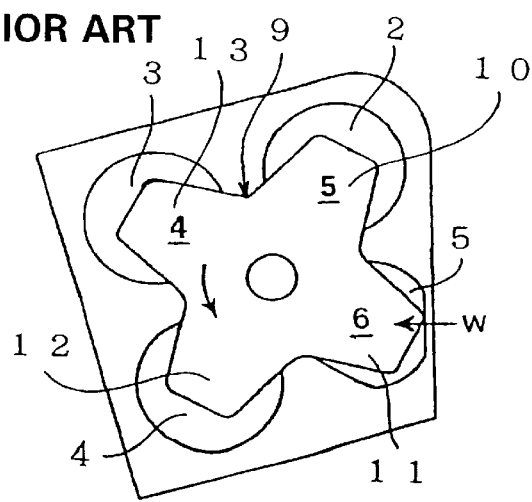

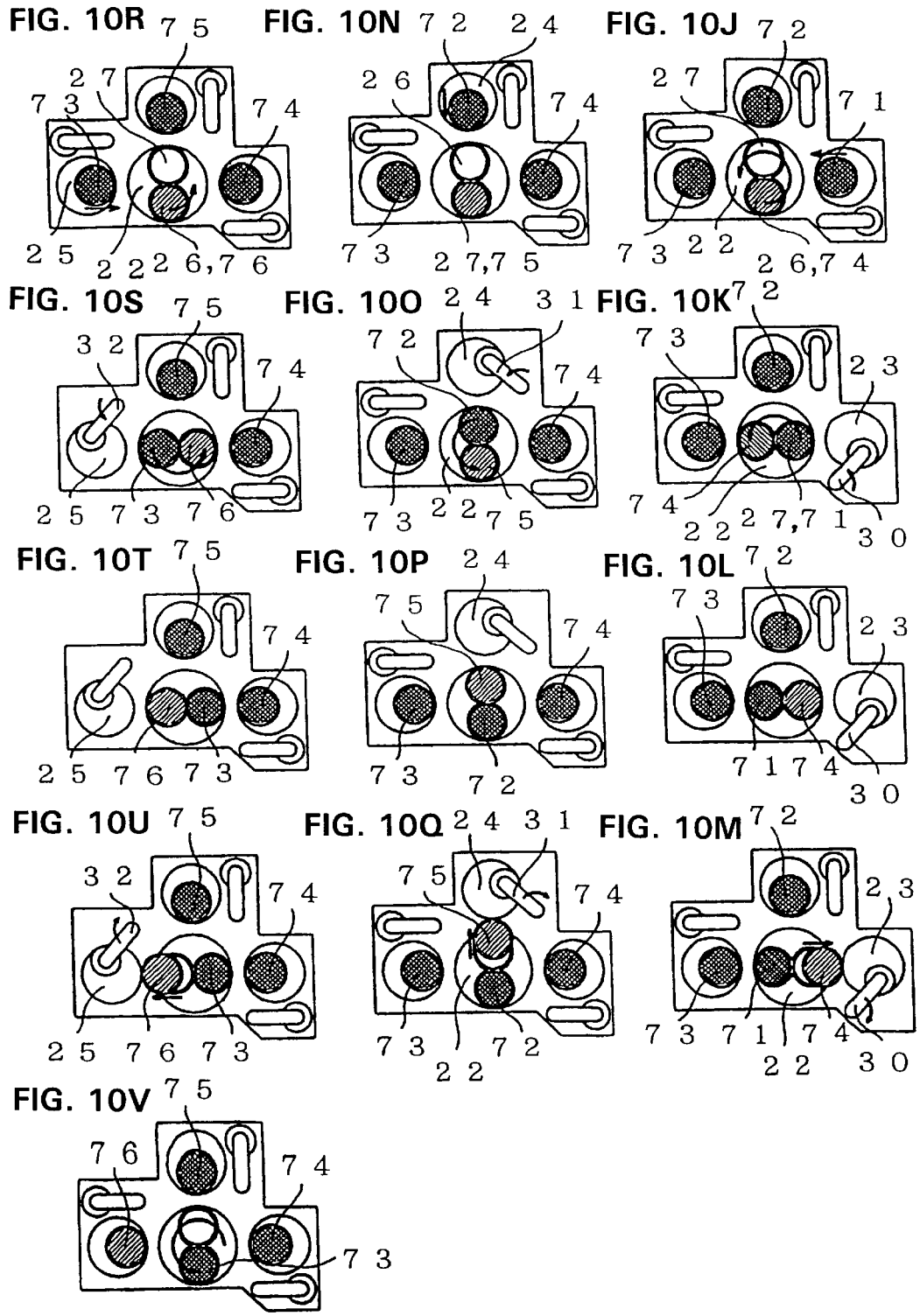

6,062,954

SEMICONDUCTOR WAFER SURFACE FLATTENING APPARATUS

This patent application claims priority based on the Japanese patent application, H10-15005, filed on Jan. 9, 1998, the contents of which are incorporated herein by reference.

BACKGROUND OF THE INVENTION

1. Field of the Invention

The present invention relates to a semiconductor wafer surface flattening apparatus for flattening the surfaces of semiconductor wafers by chemical-mechanically polishing the surfaces of the semiconductor wafers using polishing pads and a polishing liquid.

2. Description of Related Art

For example, a conventional semiconductor wafer surface flattening apparatus of this type has been disclosed in a European patent application on May 21, 1997, (Disclosure Number: EPO774323A2, Title of the Invention: APPARATUS AND METHOD FOR POLISHING SUBSTRATES). This apparatus is generally called a CMP (Chemical Mechanical Polish) apparatus. FIG. 1 shows an oblique view of the structure of this apparatus.

Three rotating surface plates (platens) 2, 3, and 4, and a load-and-unload station 5 are installed on a base 1. A polish pad is glued on the surface of each of the platens 2, 3, and 4. Dressers 6, 7, and 8 for polishing the surfaces of these polishing pads are installed near the platens 2, 3, and 4, respectively. A freely rotatable carousel 9 is installed on the base 1. The carousel 9 supports four carriers 10, 11, 12, and 13. Each of the four carriers 10, 11, 12, and 13 holds a semiconductor wafer. When the carousel 9 rotates by a prescribed angle, the carousel 9 indicates the rotation positions of the semiconductor wafers the carriers 10 through 13 are holding.

In an operation mode, called the in-line mode, the three platens 2, 3, and 4 separately and sequentially polish the surfaces of multiple semiconductor wafers for the first time. For example, this polish operation is carried out in the following manner.

First, a robot not shown in FIG. 1 loads a first semiconductor wafer W from a wafer cassette onto the load-and-unload station 5. As shown in FIG. 2A, the carrier 10 holds this first semiconductor wafer W. Next, as shown in FIG. 2B, the carousel 9 rotates counterclockwise by 90 degrees, and transports the first semiconductor wafer W onto the platen 2. Then, as the carrier 10 presses with a prescribed pressure the first semiconductor wafer W onto the polish pad that is installed on the platen 2, a polish liquid (slurry) is supplied to the polish pad. Then as the platen 2 and the carrier 10 rotate, the first semiconductor wafer W is chemical-mechanically polished for a minute. While the first semiconductor wafer W is being polished, a second semiconductor wafer W is loaded onto the load-and-unload station 5. The carrier 11 then picks up and holds the second semiconductor wafer W.

When the platen 2 finishes polishing the first semiconductor wafer W for the first time, the carousel 9 rotates counterclockwise by 90 degrees. Subsequently, as shown in FIG. 2C, the carrier 10 moves onto the platen 3 and the carrier 11 moves onto the platen 2. Then the platen 3 chemical-mechanically polishes the first semiconductor wafer W for the second time for a minute. At the same time, the platen 2 chemical-mechanically polishes the second semiconductor wafer W for the first time for a minute. During this one minute, a third semiconductor wafer W is loaded onto the load-and-unload station 5. Then the carrier 12 picks up and holds the loaded third semiconductor wafer W.

Next, the carousel 9 rotates counterclockwise by 90 degrees. Consequently, as shown in FIG. 2D, the carrier 10 is moved onto the platen 4, the carrier 11 is moved onto the platen 3, and the carrier 12 is moved onto the platen 2. Then the platen 4 chemical-mechanically polishes the first semiconductor wafer W for the third and last time for a minute. At the same time, the platen 3 chemical-mechanically polishes the second semiconductor wafer W for the second time for a minute, and the platen 2 chemical-mechanically polishes the third semiconductor wafer W for the first time for a minute. During this one minute, a fourth semiconductor wafer W is loaded onto the load-and-unload station 5. Then the carrier 13 picks up and holds the loaded fourth semiconductor wafer W.

Next, the carousel 9 rotates clockwise by 270 degrees. Consequently, as shown in FIG. 2E, the carrier 10 is returned to the load-and-unload station 5. Then the carrier 10 unloads the first semiconductor wafer W onto the load-and-unload station 5. The robot then stores this unloaded first semiconductor wafer W in a wafer cassette. At the same time, the platen 4 chemical-mechanically polishes the second semiconductor wafer W for the last time for a minute, the platen 3 chemical-mechanically polishes the third semiconductor wafer W for the second time for a minute, and the platen 2 chemical-mechanically polishes the fourth semiconductor wafer W for the first time for a minute. During this one minute, as shown in FIG. 2F, a fifth semiconductor wafer W is loaded onto the load-and-unload station 5. Then the carrier 10 picks up and holds the loaded fifth semiconductor wafer W.

After this, the above-described process is repeated. In this way, semiconductor wafers are sequentially polished.

In an operation mode of the CMP apparatus, called the batch mode, the platens 2, 3, and 4 polish the surfaces of semiconductor wafers W for the first time in parallel. An example of a manner in which the CMP apparatus operates in the batch mode is provided in the following. In this batch mode, each of the three semiconductor wafers is polished at exactly one platen, and is not polished separately at multiple platens as in the in-line mode.

First, as shown in FIG. 3A, the robot supplies a first semiconductor wafer W onto the load-and-unload station 5. Then the carrier 10 picks up and holds the loaded first semiconductor wafer W. Subsequently, the carousel 9 rotates counterclockwise by 90 degrees. Next, as shown in FIG. 3B, the robot supplies a second semiconductor wafer W onto the load-and-unload station 5. Then the carrier 11 picks up and holds the loaded second semiconductor wafer W. Subsequently, the carousel 9 rotates counterclockwise by 90 degrees. Next, as shown in FIG. 3C, the robot supplies a third semiconductor wafer W onto the load-and-unload station 5. Then the carrier 12 picks up and holds the loaded third semiconductor wafer W. Subsequently, the carousel 9 rotates counterclockwise by 90 degrees.

Consequently, as shown in FIG. 3D, the first semiconductor wafer W held by the carrier 10 is moved onto the platen 4, the second semiconductor wafer W held by the carrier 11 is moved onto the platen 3, and the third semiconductor wafer W held by the carrier 12 is moved onto the platen 2. Subsequently, the carriers 10, 11, and 12 descend onto the platens 4, 3, and 2, respectively. The first through third semiconductor wafers W are then chemical-mechanically polished for three minutes on the platens 4, 3, and 2, respectively. While the first through third semiconductor wafers W are being polished, the robot supplies a fourth semiconductor wafer W onto the load-and-unload station 5. Then the carrier 13 picks up and holds the loaded fourth semiconductor wafer W.

Next, the carousel 9 rotates clockwise by 90 degrees. Consequently, as shown in FIG. 3E, the third semiconductor wafer W held by the carrier 12 is moved onto the load-and-unload station 5. Then the robot unloads the third semiconductor wafer W into the wafer cassette. Next, the carousel 9 rotates clockwise by 90 degrees. Consequently, as shown in FIG. 3F, the second semiconductor wafer W held by the carrier 11 is moved onto the load-and-unload station 5. Then the robot unloads the second semiconductor wafer W into the wafer cassette. After this, the carousel 9 rotates clockwise by 90 degrees. Consequently, as shown in FIG. 4G, the first semiconductor wafer W held by the carrier 10 is moved onto the load-and-unload station 5. Then the robot unloads the first semiconductor wafer W into the wafer cassette.

Next, as shown in FIG. 4H, the robot supplies a fifth semiconductor wafer W onto the load-and-unload station 5. Then the carrier 10 picks up and holds the loaded fifth semiconductor wafer W. Subsequently, as shown in FIG. 4I, the carousel 9 rotates counterclockwise by 90 degrees. Then the robot supplies a sixth semiconductor wafer W onto the load-and-unload station 5, and the carrier 11 picks up and holds the loaded sixth semiconductor wafer W. After this, the carousel 9 rotates counterclockwise by 90 degrees. Subsequently, the fourth semiconductor wafer W held by the carrier 13, the fifth semiconductor wafer W held by the carrier 10, and the sixth semiconductor wafer W held by the carrier 11 are chemical-mechanically polished in parallel for three minutes on the platens 4, 3, and 2, respectively.

After this, the above-described process is repeated.

The performance of a CMP apparatus is evaluated based on such characteristics as the footprint and the throughput as well as the polish characteristic. Needless to say, the polish characteristic of a CMP apparatus needs to be excellent. However, characteristics such as the footprint and throughput of a CMP apparatus play important roles in evaluating the performance of a CMP apparatus. Both of these characteristics heavily influence the manufacturing cost of semiconductor wafers, and consequently the product cost of LSI. The footprint of a CMP apparatus represents the total area of the apparatus. In a clean room, it is desirable that a CMP apparatus occupy a small area. The throughput of a CMP apparatus represents the total number of semiconductor wafers the CMP apparatus can process per unit time. It is desirable that the throughput of a CMP apparatus be high.

In the above-explained in-line mode, while the three semiconductor wafers are being polished on three platens 2,3 and 4, the next semiconductor wafer is prepared by the remaining carrier. Thus, during the simultaneous dressing, in which the polish pad is dressed (conditioned) while the semiconductor wafer is being polished, the three carriers continue to polish the semiconductor wafers, except during the time interval in which the carousel 9 determines the rotation positions of the semiconductor wafers. Therefore, the carriers have a short non-polish time interval, or equivalently, a high operation rate, resulting in an excellent operation efficiency of the CMP apparatus. In the case in which the polish time interval is set to three minutes, and each of the platens 2 through 4 polishes a given semiconductor wafer for one minute (=60 [seconds]) by work-sharing, according to data shown on the 1996 VMIC (VLSI Multilevel Interconnection) Conference (Reference Number: Library of Congress No. 89-644090), the throughput of the above-described conventional CMP apparatus turns out to be 45 semiconductor wafers per hour in accordance with the following equation (1). In other words, the total number of semiconductor wafers the CMP apparatus can polish per hour is 45. Here, 20 [seconds] represents the length of time the carousel 9 spends in order to determine the rotation positions of the semiconductor wafers.

$$3600/(60+20)=45 \qquad (1)$$

The above-described conventional CMP apparatus, which operates in the in-line mode, has a high throughput value. However, such polish characteristics as the polish stability and re-producibility of the above-described conventional CMP apparatus are unstable.

In a CMP process, it is very important that the throughput and polish performance or so-called process performance of a CMP apparatus be excellent and stable. For example, when 100 semiconductor wafers contained in a lot are chemical-mechanically polished, the polish characteristics of the CMP apparatus at the time the CMP apparatus polishes the tenth semiconductor wafer is required to be the same as that at the time the CMP apparatus polishes the 100th semiconductor wafer. The polish characteristics of the CMP apparatus heavily depend particularly on the performance of the polish pads. However, the material characteristics values of the polish pads, such as their thickness, elasticity recovery rates, and the like, differ minutely from one polish pad to another even if the polish pads have been manufactured under the same conditions. In addition, even if the polish pads of multiple platens are dressed under the same conditions, discrepancies among the polish characteristics of the polish pads gradually arise as the pad dressing is repeated.

Therefore, in order to polish many semiconductor wafers in a large number of lots, it is necessary to measure the thickness of the post-polish semiconductor wafers, for example, one semiconductor wafer for every 20 semiconductor wafers so as to reset the process parameters. In this way, the polish characteristics discrepancies among the polish pads are eliminated. In resetting the process parameters, the above-described conventional CMP apparatus, which operates in the in-line mode, polishes a semiconductor wafer using multiple polish pads. Hence, it is difficult to determine precisely which polish pads on the platens are problematic and how those problematic polish pads are affecting the process parameters. Therefore, in reality, it is difficult to operate the above-described conventional CMP apparatus in the in-line mode and have the conventional CMP apparatus perform the first split-operation polish.

On the other hand, in the above-explained batch mode, three platens simultaneously chemical-mechanically polish three semiconductor wafers. Each of the semiconductor wafers is processed on one platen to the end. Therefore, in the above-explained conventional CMP apparatus that operates in the batch mode, the above-described problem caused by the split-operation polish does not arise, and the polish characteristics of the CMP apparatus remain stable. However, after the first three semiconductor wafers have been polished simultaneously, fifth and sixth semiconductor wafers need to be newly supplied from the wafer cassette to the carriers. The fourth semiconductor wafer is picked up and held by the corresponding carrier while the three semiconductor wafers are being polished simultaneously.

It follows that the platens 2, 3, and 4 cannot polish the semiconductor wafers while the fifth and sixth semiconductor wafers are being introduced from the wafer cassette to the carriers. According to data shown on page 203 of the 1996 VMIC (VLSI Multilevel Interconnection) Conference (Reference Number: Library of Congress No. 89-644090), the required length of time during which the platens 2, 3, and 4 cannot polish the semiconductor wafers is in the range between 1.25 minutes (=75 seconds) and 1.75 minutes (=105 seconds). Hence, since the polish time interval is 3 minutes (=180 seconds), in accordance with the following equations (2) and (3), when the above-described conventional CMP apparatus operates in the batch mode, the throughput of the conventional CMP apparatus lies in the range between 37.9 semiconductor wafers per hour and 42.4 semiconductor wafers per hour.

$$\{3600/(180+75)\} \times 3 = 42.4 \qquad (2)$$

$$\{3600/(180+105)\} \times 3 = 37.9 \qquad (3)$$

Therefore, when the above-described conventional CMP apparatus operates in the batch mode, the CMP apparatus cannot achieve a high throughput value, such as 45 semiconductor wafers per hour that it achieves when it operates in the in-line mode.

SUMMARY OF THE INVENTION

Given these circumstances, it is an object of the present invention to provide a semiconductor wafer surface flattening apparatus having stable polish characteristics, a small footprint, and a high throughput value.

In order to achieve this objective, a semiconductor wafer surface flattening apparatus according to the present invention has multiple surface plates, multiple carriers, and a control apparatus. A polish pad is installed on each of the surface plates. The number of the carriers is the same as that of the surface plates. Each of the carriers holds and transports a semiconductor wafer, and presses the surface to be polished of the held semiconductor wafer onto the polish pad with a prescribed pressure. The control apparatus controls the operation of these carriers. The semiconductor wafer surface flattening apparatus according to the present invention mechanically polishes the surface of each of the multiple semiconductor wafers using the corresponding polish pad. At the same time, the semiconductor wafer surface flattening apparatus supplies a polish liquid to the polish pads, and chemically polishes the surface of each of the multiple semiconductor wafers. In addition, the semiconductor wafer surface flattening apparatus according to the present invention has an index table which rotates and indicates the rotation position of each of the semiconductor wafers. The multiple surface plates are installed around the index table. The carriers are installed above the surface plates so that one carrier is positioned above one surface plate. These carriers cyclically transport the semiconductor wafers between the index table and the surface plates. The control apparatus also controls the determination of the rotation position of the index table.

According to this configuration, after a first pre-polish semiconductor wafer is introduced to the index table, the control apparatus determines the rotation position of the index table. Then the first pre-polish semiconductor wafer is transported to a position near one of the surface plates. The carrier positioned above the surface plate near the first semiconductor wafer then holds this first semiconductor wafer. The carrier transports the first semiconductor wafer onto the surface plate, on which the first semiconductor wafer is polished. While the first semiconductor wafer is being polished, a second pre-polish semiconductor wafer is supplied to the index table. After the control apparatus determines the next rotation position of the index table, this second pre-polish semiconductor wafer is transported to a position near another surface plate. Then the carrier positioned above the surface plate near the second pre-polish semiconductor wafer picks up and holds the second pre-polish semiconductor wafer, transports the second pre-polish semiconductor wafer to the surface plate, on which the second pre-polish semiconductor wafer is polished.

In the conventional CMP apparatus, all the carriers are supported by the carousel 9, and the rotation positions of the carriers are determined when the carousel 9 rotates. Therefore, once the carriers press the semiconductor wafers onto the polish pads that are fixed on the platens, and the semiconductor wafers start to be polished, the carousel 9 cannot be rotated until the polishing operation is completed. Thus, a new pre-polish semiconductor wafer cannot be moved to another surface plate by rotating the carousel 9.

In contrast, according to the present invention, the index table moves each of the semiconductor wafers to the work area of the respective carrier. Moreover, the carriers operate independently of each other. Thus, while some of the carriers are polishing semiconductor wafers pressing the semiconductor wafers onto the polish pads on the surface plates, the index table or the other carriers can move new pre-polish semiconductor wafers to the other surface plates. In this way, the semiconductor wafers are polished sequentially without being interrupted.

As a result, the present invention provides a semiconductor wafer surface flattening apparatus having stable polish characteristics, a small footprint, and a high throughput value.

BRIEF DESCRIPTION OF THE DRAWINGS

FIGS. 3A through 3F are top view drawings showing the first process flow in an operation mode in which the conventional CMP apparatus polishes semiconductor wafers simultaneously for the first time.

FIGS. 4G through 4I are top view drawings showing the second process flow in an operation mode in which the conventional CMP apparatus polishes semiconductor wafers simultaneously for the first time.

FIGS. 10J through 10V are top view drawings showing the second process flow in an operation mode in which the CMP apparatus according to the present embodiment polishes semiconductor wafers simultaneously for the first time.

DETAILED DESCRIPTION OF THE INVENTION

The preferred embodiment of the present invention will be explained in reference to the attached drawings.

Next, an embodiment of the present invention will be explained, in which a semiconductor wafer surface flattening apparatus according to the present invention is used as a CMP apparatus.

Figure 1:
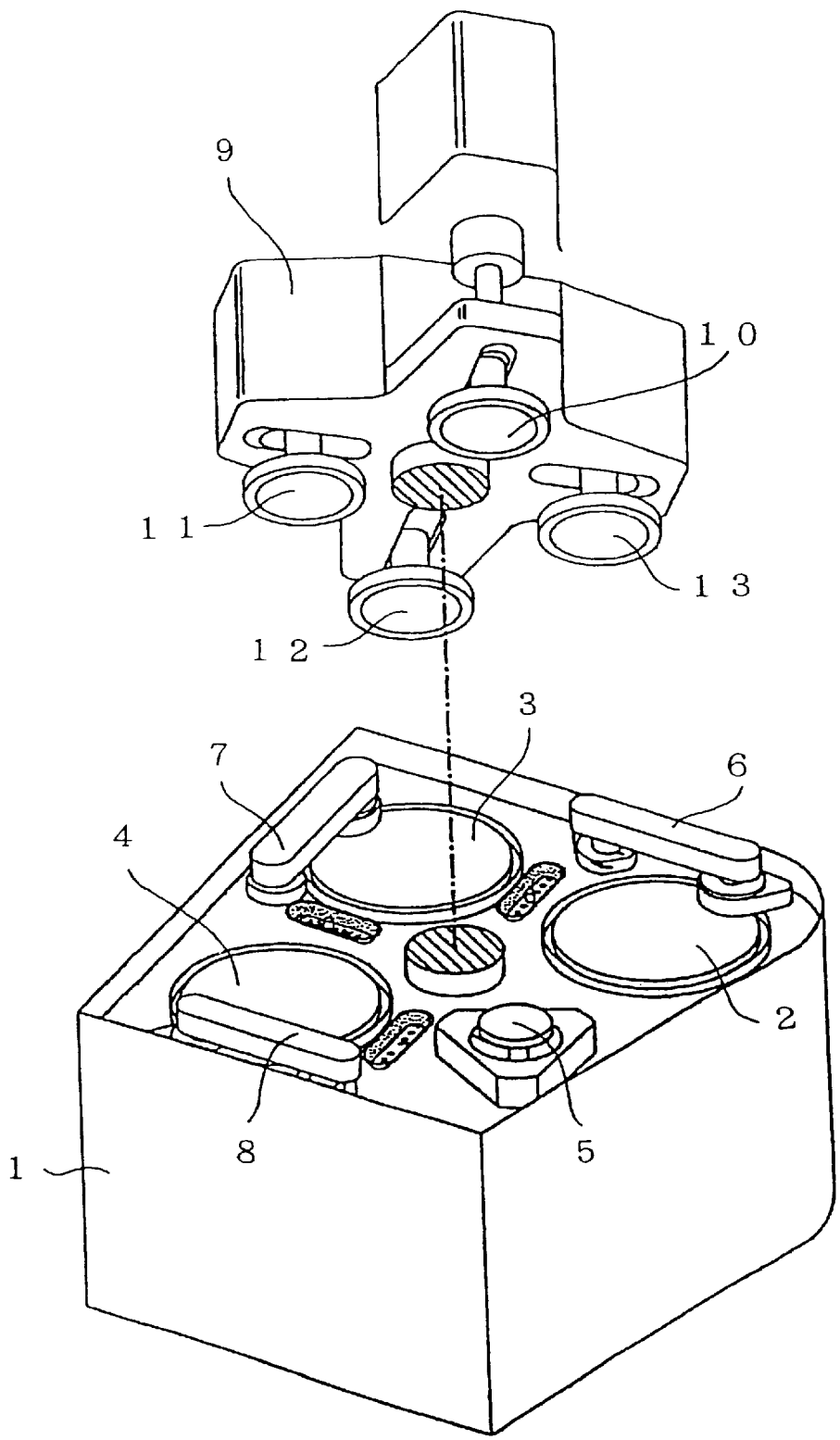
FIG. 1 is an oblique view drawing showing the structure of the conventional CMP apparatus.
Figure 2A:
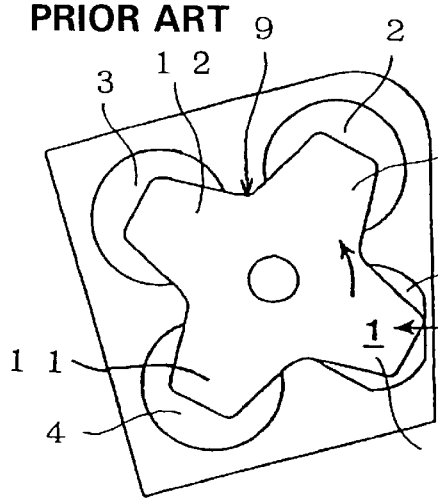
FIGS. 2A through 2F are top view drawings showing the process flow in an operation mode in which the conventional CMP apparatus polishes semiconductor wafers for the first time by cyclic split-operations.
Figure 2B:
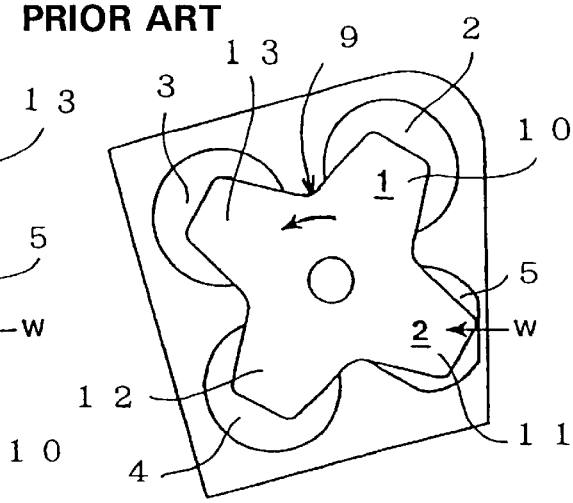
Figure 2C:
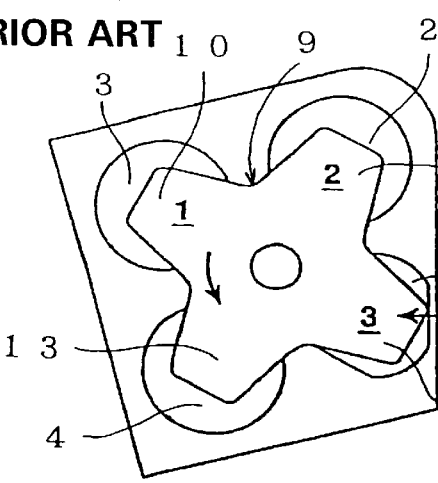
Figure 2D:
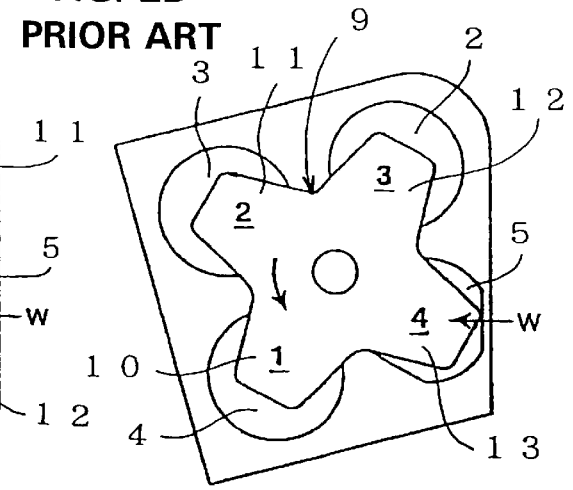
Figure 2E:
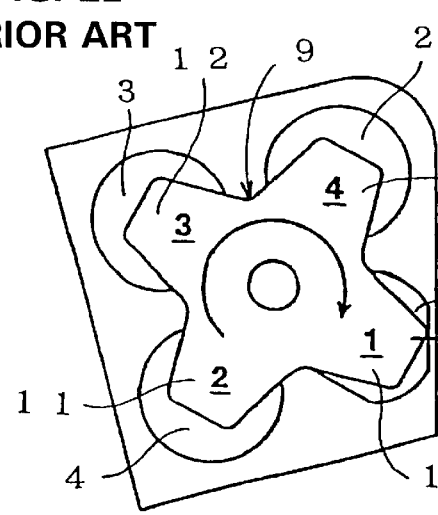
Figure 2F:
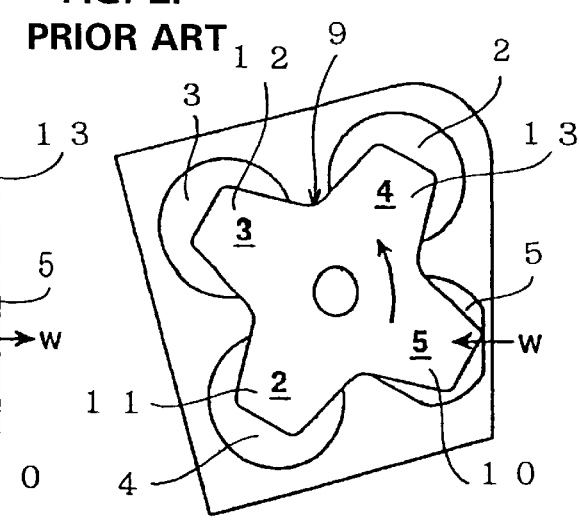
Figure 5:
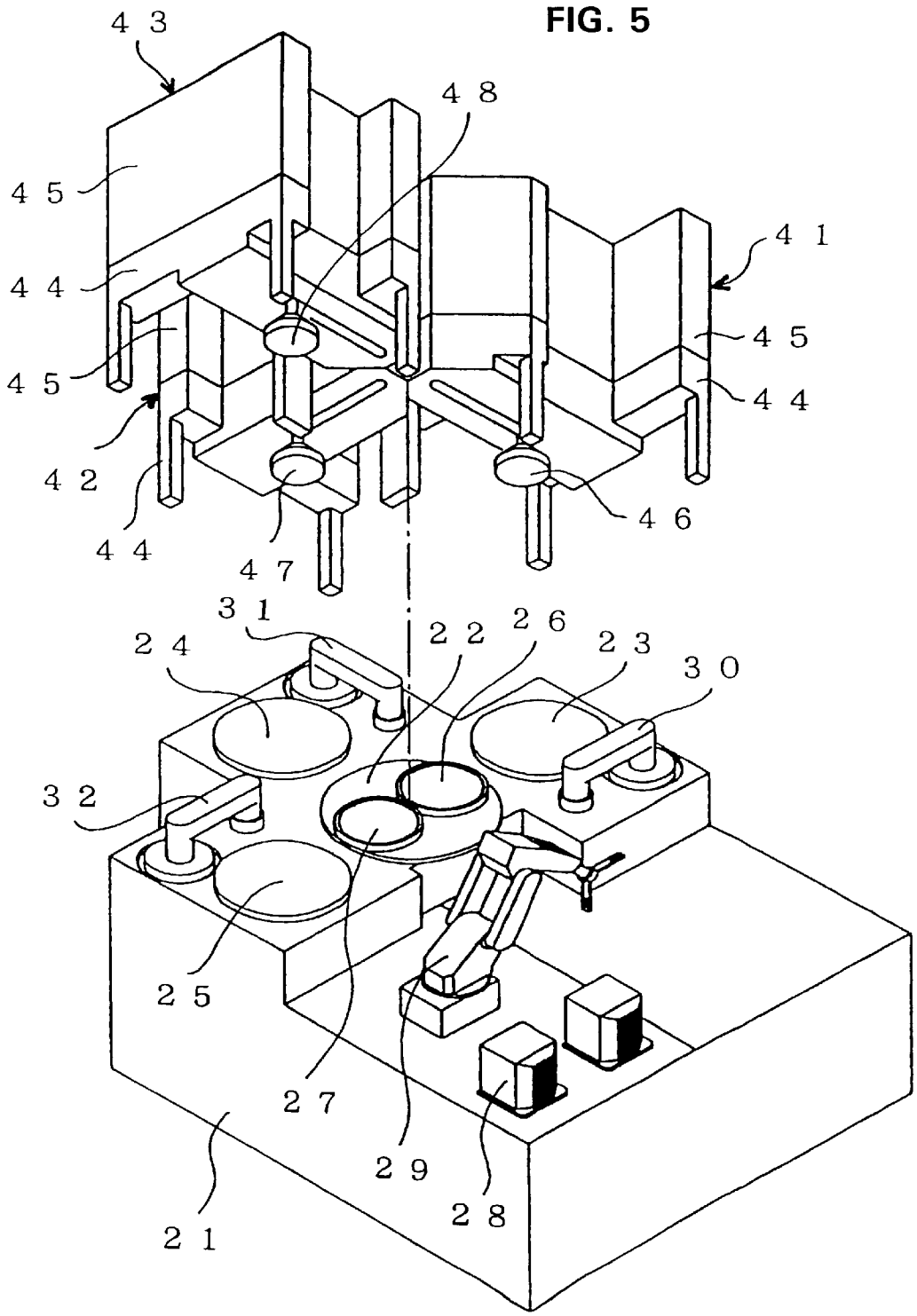
FIG. 5 is an oblique view drawing showing the structure of a semiconductor wafer surface flattening apparatus (CMP apparatus) according to an embodiment of the present invention.

FIG. 5 shows an oblique view of the structure of a semiconductor wafer surface flattening apparatus (CMP apparatus) according to the present embodiment.

The CMP apparatus according to the present embodiment has a base 21, a disk-shaped index table 22 that is installed on the base 21, three platens 23, 24, and 25, which are installed around this index table 22, and two cups 26 and 27 that are installed on the index table 22, a wafer cassette 28 for storing semiconductor wafers, and a robot 29. A semiconductor wafer is loaded onto each of the cups 26 and 27. The robot 29 picks up a semiconductor wafer from the wafer cassette 28, and transports the semiconductor wafer onto the cup 26 or 27. A motor not shown in FIG. 5 but stored inside the base 21 rotates the index table 22 so as to move the semiconductor wafer loaded on the cup 26 or 27.

In addition, the CMP apparatus according to the present embodiment has three disk-shaped platens 23, 24, and 25 on each of which a polish pad is glued, and three dressers 30, 31, and 32 for polishing the polish pads glued on the platens 23, 24, and 25, respectively. According to the present embodiment, a hard polish pad IC1000 (product name) made by Rodele Nitta Company is used to polish the semiconductor wafer for the first time, and a soft polish pad SUPREME (product name) made by Rodele Nitta Company is used to polish the semiconductor wafer for the second time. Three additional motors are stored inside the base 21 but not shown in FIG. 5 so as to rotate the platens 23, 24, and 25, respectively.

Figure 6:
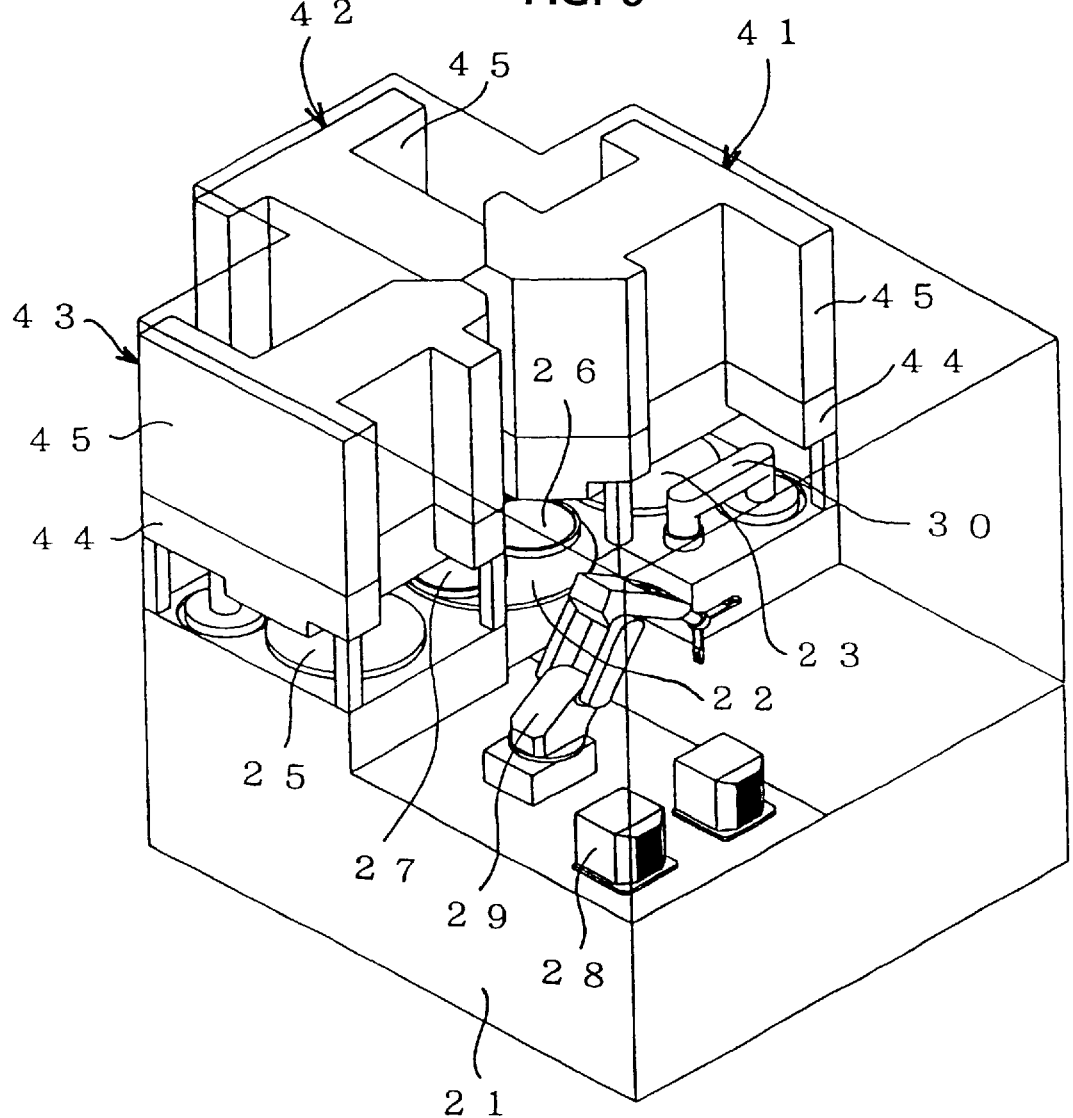
FIG. 6 is an oblique view drawing showing a state in which a carrier supporting mechanism is installed in the base of the CMP apparatus shown in FIG. 5.

The CMP apparatus according to the present embodiment also has three carrier supporting mechanisms 41, 42, and 43, which are installed on the base 21, three bottom frames 44, three top frames 45, three carriers 46, 47, and 48. The carrier supporting mechanisms 41, 42, and 43 are identically structured. Each of the carrier supporting mechanisms 41, 42, and 43 is held by a bottom frame 44 and a top frame 45. Below the bottom frames 44 of the carrier supporting mechanisms 41, 42, and 43, the carriers 46, 47, and 48 are installed, respectively. These three carriers 46, 47, and 48 operate independently of each other. FIG. 6 shows a state in which the carrier supporting mechanisms 41, 42, and 43 are installed on the base 21. In FIG, 6, the same reference codes are given to the components that are already shown in FIG. 5. These same components will not be explained again here.

Figure 7:
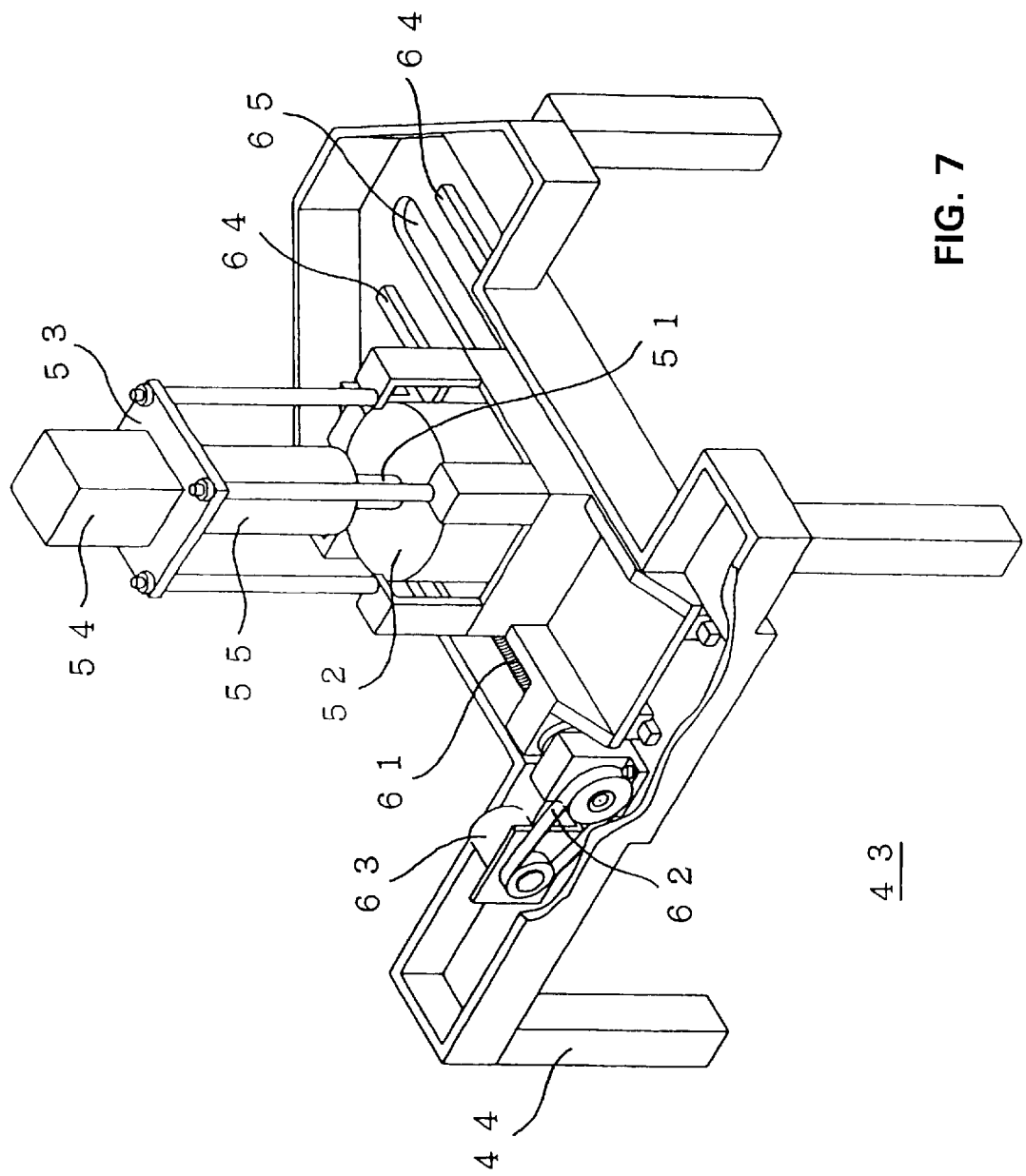
FIG. 7 is an oblique view drawing showing the structure of the carrier supporting mechanism which constitutes the semiconductor wafer surface flattening apparatus (CMP apparatus) according to the present embodiment.

FIG. 7 shows a state in which the top frame 45 of the carrier supporting mechanism 43 is removed and the interior of the carrier supporting mechanism 43 is exposed. The carrier 48 is attached to the end of a hollow cylindrical axis 51 that extends below from a notched slit-shaped hole 65. When a motor 52 rotates this axis 51, the carrier 48 rotates together with this axis 51. In addition, when an air cylinder 54 fixed on a frame 53 moves the axis 51 up and down, the carrier 48 moves up and down together with the axis 51. Moreover, an air duct is formed inside the hollow cylindrical axis 51. When a pump not shown in FIG. 7 removes the air inside this air duct, the carrier 48 adsorbs onto its hold surface a semiconductor wafer. The semiconductor wafer adsorbed and held onto the hold surface of the carrier 48 is pressed onto the polish pad with a prescribed pressure when the semiconductor wafer is polished. A load cell 55 measures this prescribed pressure.

The bottom portion of the frame 53 spirally matches a ball screw 61. When a motor 63 is turned on, the rotary driving force of the motor 63 is transferred to the ball screw 61 via a belt 62. When the motor 63 rotates the ball screw 61, the frame 53 slides along a straight rail 64 in the direction of the axis of the ball screw 61, and the carrier 48 reciprocates between the platen 25 and the index table 22.

Figure 8:
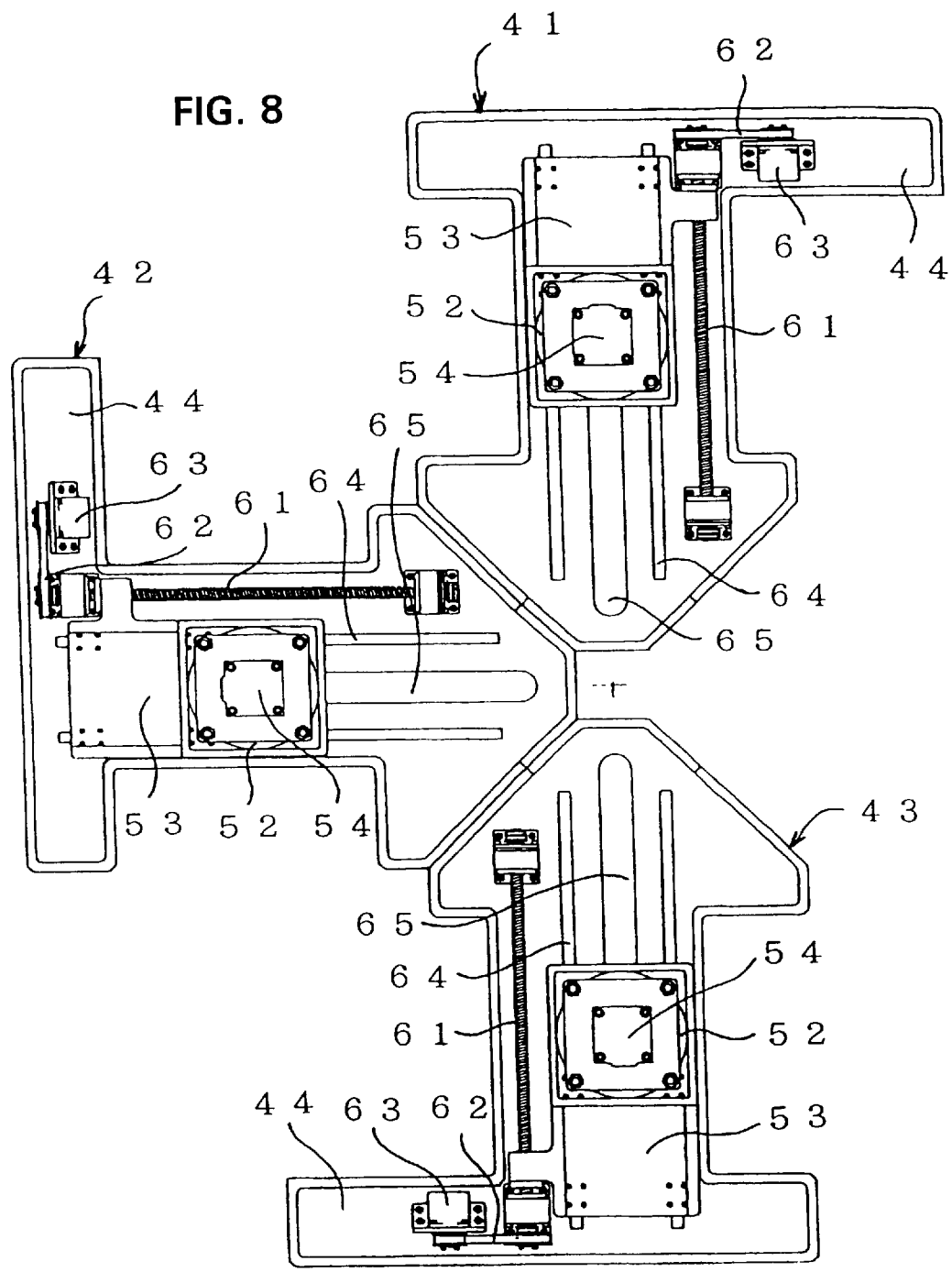
FIG. 8 is a top view drawing showing a state in which three carrier supporting mechanisms shown in FIG. 7 are combined.

FIG. 8 is a top view drawing showing a state in which the three carrier supporting mechanisms 41, 42, and 43 are combined. In FIG. 8, the same reference codes are given to the components that are already shown in FIG. 7. These same components will not be explained again here. Since the identically structured carrier supporting mechanisms 41, 42, and 43 are combined in this manner, the three semiconductor wafers held by the carriers 46, 47, and 48, respectively, can be independently moved between the index table 22 and the platens 23, 24, and 25, respectively.

A control apparatus not shown in the drawings is stored inside the base 21. This control apparatus controls the operations of the carriers 46, 47, and 48, the operations of the dressers 30, 31, and 32, the rotation angle of the index table 22, and the rotation operations of the platens 23, 24, and 25. This control apparatus is constituted of electronic circuits using a microcomputer.

Next, operations of the CMP apparatus thus structured according to the present embodiment will be explained.

First, an operation mode, in which the CMP apparatus performs the first polish simultaneously on the platens 23, 24, and 25, will be explained. In this case, a hard polish pad (IC1000) is glued to the surface of each of the platens 23, 24, and 25.

First, the robot 29 takes out a first pre-polish semiconductor wafer 71 from the wafer cassette 28. Then as shown in FIG. 9A, the first semiconductor wafer 71 is placed on the cup 26 that is fixed on the index table 22. In each of the figures to be explained in the following, pre-polish semiconductor wafers are shaded with oblique lines having a positive slope. Next, the control apparatus rotates the index table 22 counterclockwise by 90 degrees. As shown in FIG. 9B, this causes the first semiconductor wafer 71 to be moved to a position near the platen 23. Then, the carrier 46 descends onto the first semiconductor wafer 71, and adsorbs and holds the back surface (substrate side) of the first semiconductor wafer 71.

In this case, the dresser 30 moves onto the platen 23. As the platen 23 rotates, the dresser 30 conditions the polish pad that is glued to the platen 23. Next, as shown in FIG. 9C, the dresser 30 returns to its original position. Subsequently, the carrier 46 carries the first semiconductor wafer 71 from the index table 22 onto the platen 23. As a result, the front surface (device formation surface) of the first semiconductor wafer 71 faces the front surface of the platen 23.

After this, the carrier 46 rotates and descends onto the polish pad of the platen 23. Then the polish pad of the rotating platen 23 presses the device formation surface of the first semiconductor wafer 71 with a prescribed pressure. In this way, the first semiconductor wafer 71 is mechanically polished. While the first semiconductor wafer 71 is mechanically being polished, a slurry supply nozzle not shown in the drawings supplies a slurry onto the device formation surface of the first semiconductor wafer 71. In this way, the device formation surface of the first semiconductor wafer 71 is chemically polished also. The slurry is usually an alkaline (or acidic) liquid in which polish particles are diffused. The number of rotations of the platen 23, the number of rotations of the carrier 46, the pressure the carrier 46 applies to the device formation surface of the first semiconductor wafer 71, the amount of flowing of the slurry to be supplied to the device formation surface of the first semiconductor wafer 71, and the like, are preset in the control apparatus before the polishing process starts.

While the platen 23 is chemical-mechanically polishing the first semiconductor wafer 71, the index table 22 is rotated counterclockwise by 90 degrees. Then, as shown in FIG. 9D, the robot 29 picks up a second semiconductor wafer 72 from the wafer cassette 28, and places the second semiconductor wafer 72 onto the cup 27. After this, the index table 22 is rotated counterclockwise by 180 degrees. Then, as shown in FIG. 9E, the second semiconductor wafer 72 is moved to a position near the platen 24.

In this case, the dresser 31 moves onto the platen 24. When the platen 24 rotates, the dresser 31 conditions the polish pad glued to the platen 24. Next, as shown in FIG. 9F, the dresser 31 is returned to its original position. Subsequently, the carrier 47 moves the second semiconductor wafer 72 from the index table 22 onto the platen 24. As a result, the device formation surface of the second semiconductor wafer 72 faces the surface of the platen 24. After this, the carrier 47 rotates and descends onto the polish pad of the rotating platen 24. Then the device formation surface of the second semiconductor wafer 72 is pressed onto the polish pad of the rotating platen 24 with a prescribed pressure. At the same time, the slurry is supplied to the polish pad. In this way, the second semiconductor wafer 72 is chemical-mechanically polished.

Figure 9G:
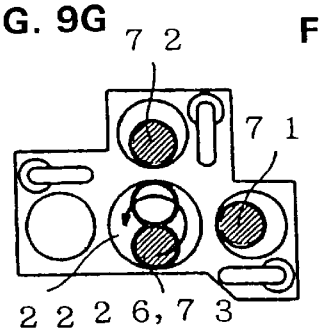
FIGS. 9A through 9I are top view drawings showing the first process flow in an operation mode in which the CMP apparatus according to the present embodiment polishes semiconductor wafers simultaneously for the first time.
Figure 9D:
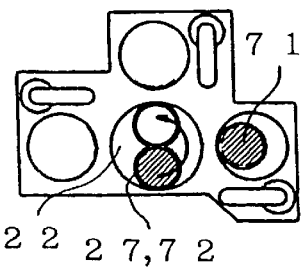
Figure 9A:
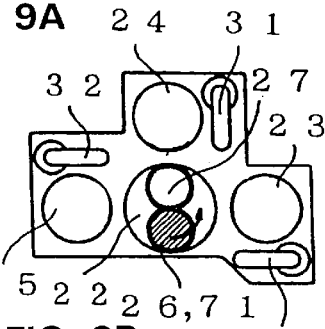
Figure 9H:
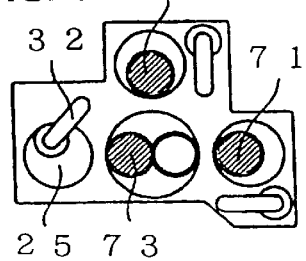
Figure 9E:
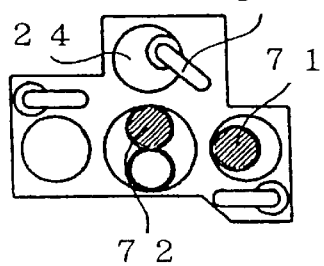
Figure 9B:
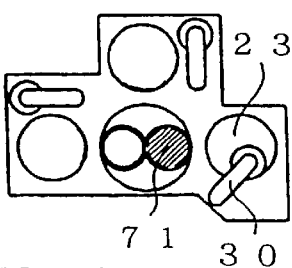

While the platens 23 and 24 are chemical-mechanically polishing the first and second semiconductor wafers 71 and 72, respectively, as shown in FIG. 9G, the robot 29 picks up a third semiconductor wafer 73 from the wafer cassette 28, and places the third semiconductor wafer 73 onto the cup 26. After this, the index table 22 is rotated counterclockwise by 270 degrees. Consequently, as shown in FIG. 9H, the third semiconductor wafer 73 is moved to a position near the platen 25.

Figure 9I:
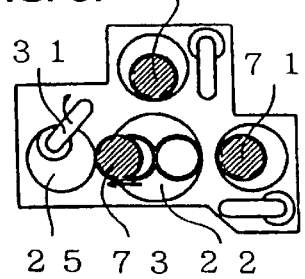
Figure 9F:
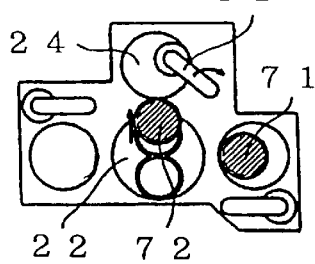
Figure 9C:
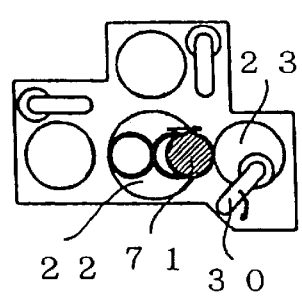

In this case, the dresser 32 moves onto the platen 25. When the platen 25 rotates, the dresser 32 conditions the polish pad glued to the platen 25. Next, as shown in FIG. 9I, the dresser 31 is returned to its original position. Subsequently, the carrier 48 moves the third semiconductor wafer 73 from the index table 22 onto the platen 25. As a result, the device formation surface of the third semiconductor wafer 73 faces the surface of the platen 25. After this, the carrier 48 rotates and descends onto the polish pad of the rotating platen 25. Then the device formation surface of the third semiconductor wafer 73 is pressed onto the polish pad of the rotating platen 25 with a prescribed pressure. At the same time, the slurry is supplied to the polish pad. In this way, the third semiconductor wafer 73 is chemical-mechanically polished.

While the platens 23, 24 and 25 are chemical-mechanically polishing the first, second, and third semiconductor wafers 71, 72, and 73, respectively, the index table 22 is rotated counterclockwise by 90 degrees. Then, as shown in FIG. 10J, the robot 29 picks up a fourth semiconductor wafer 74 from the wafer cassette 28, and places the fourth semiconductor wafer 74 onto the cup 26. After this, the index table 22 is rotated counterclockwise by 270 degrees. Then, as shown in FIG. 10K, the empty cup 27 is moved to a position near the platen 23.

At this stage, the first semiconductor wafer 71 placed on the platen 23 has been polished for three minutes for the first time. The carrier 46 then moves the first semiconductor wafer 71 to the empty cup 27. In each of the drawings to be explained in the following, those semiconductor wafers that have already been polished for the first time are indicated by crossing oblique lines forming a grid. After this, the index table 22 is rotated counterclockwise by 180 degrees. Consequently, as shown in FIG. 10L, the pre-polish fourth semiconductor wafer 74 to be polished is moved to the neighborhood of the empty platen 23. At the same time, the dresser 30 moves onto the platen 23. When the platen 23 rotates, the dresser 30 conditions the polish pad glued to the platen 23.

Next, as shown in FIG. 10M, the dresser 30 is returned to its original position. Subsequently, the carrier 46 moves the fourth semiconductor wafer 74 from the index table 22 onto the platen 23. As a result, the device formation surface of the fourth semiconductor wafer 74 faces the surface of the platen 23. After this, the carrier 46 rotates and descends onto the polish pad of the rotating platen 23. Then the device formation surface of the fourth semiconductor wafer 74 is pressed onto the polish pad of the rotating platen 23 with a prescribed pressure. At the same time, the slurry is supplied to the polish pad. In this way, the fourth semiconductor wafer 74 is chemical-mechanically polished.

After this, the index table 22 is rotated counterclockwise by 90 degrees. Subsequently, the robot 29 removes the first semiconductor wafer 71, which has already been polished once, from the cup 27 installed on the index table 22.

Next, as shown in FIG. 10N, the robot 29 picks up a fifth semiconductor wafer 75 from the wafer cassette 28, and places the fifth semiconductor wafer 75 onto the cup 27. At this stage, the second semiconductor wafer 72 placed on the platen 24 has already been polished for three minutes for the first time. The carrier 47 then moves the second semiconductor wafer 72 onto the cup 26. FIG. 10O shows this state. Then, the dresser 31 moves onto the platen 24. When the platen 24 rotates, the dresser 31 conditions the polish pad glued to the platen 24. After this, the index table 22 is rotated counterclockwise by 180 degrees. Then, as shown in FIG. 10P, the pre-polish fifth semiconductor wafer 75 is moved to the neighborhood of the empty platen 24.

Next, as shown in FIG. 10Q, the dresser 31 is returned to its original position. Subsequently, the carrier 47 moves the fifth semiconductor wafer 75 from the index table 22 onto the platen 24. As a result, the device formation surface of the fifth semiconductor wafer 75 faces the surface of the platen 24. After this, the carrier 47 rotates and descends onto the polish pad of the rotating platen 24. Then the device formation surface of the fifth semiconductor wafer 75 is pressed onto the polish pad of the rotating platen 24 with a prescribed pressure. At the same time, the slurry is supplied to the polish pad. In this way, the fifth semiconductor wafer 75 is chemical-mechanically polished.

After this, the robot 29 removes the second semiconductor wafer 72, which has already been polished once, from the cup 26 installed on the index table 22.

Next, as shown in FIG. 10R, the robot 29 picks up a sixth semiconductor wafer 76 from the wafer cassette 28, and places the sixth semiconductor wafer 76 onto the cup 26. Then, the index table 22 is rotated counterclockwise by 90 degrees, and the empty cup 27 is moved to the neighborhood of the platen 25. At this stage, the third semiconductor wafer 73 placed on the platen 25 has already been polished for three minutes for the first time. The carrier 48 then moves the third semiconductor wafer 73 onto the cup 27. FIG. 10S shows this state. Then, the dresser 32 moves onto the platen 25. When the platen 25 rotates, the dresser 32 conditions the polish pad glued to the platen 25. After this, the index table 22 is rotated counterclockwise by 180 degrees. Then, as shown in FIG. 10T, the pre-polish sixth semiconductor wafer 76 is moved to the neighborhood of the empty platen 25.

Next, as shown in FIG. 10U, the dresser 32 is returned to its original position. Subsequently, the carrier 48 moves the sixth semiconductor wafer 76 from the index table 22 onto the platen 25. As a result, the device formation surface of the sixth semiconductor wafer 76 faces the surface of the platen 25. After this, the carrier 48 rotates and descends onto the polish pad of the rotating platen 25. Then the device formation surface of the sixth semiconductor wafer 76 is pressed onto the polish pad of the rotating platen 25 with a prescribed pressure. At the same time, the slurry is supplied to the polish pad. In this way, the sixth semiconductor wafer 76 is chemical-mechanically polished.

After this, as shown in FIG. 10V, the index table 22 is rotated counterclockwise by 270 degrees. Then the robot 29 removes the third semiconductor wafer 73, which has already been polished once, from the cup 27 installed on the index table 22.

Figure 11A:
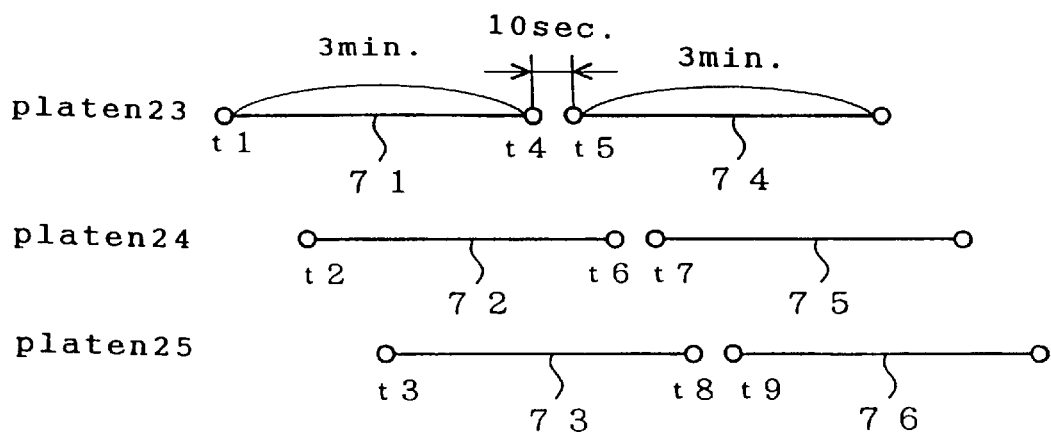
FIG. 11A is a time chart of an operation mode in which the CMP apparatus according to the present embodiment polishes semiconductor wafers simultaneously for the first time.

As shown in FIG. 11A, in the CMP apparatus according to the present embodiment, the three platens 23, 24, and 25 perform the first polish sequentially in parallel.

Specifically, the platen 23 starts to polish the first semiconductor wafer 71 for the first time at time t1. Subsequently, the platens 24 and 25 start to polish the second and third semiconductor wafers 72 and 73 for the first time at time t2 and t3, respectively. At time t4 that is three minutes after time t1, the platen 23 finishes polishing the first semiconductor wafer 71 for the first time. During the ten seconds between time t4 and time t5, the first semiconductor wafer 71, which has already been polished once on the platen 23, is exchanged with the pre-polish fourth semiconductor wafer 74. After the exchange, the platen 23 starts to polish the fourth semiconductor wafer 74.

At time t6 that is three minutes after time t2, the platen 24 finishes polishing the second semiconductor wafer 72 for the first time. During the ten seconds between time t6 and time t7, the second semiconductor wafer 72, which has already been polished once on the platen 24, is exchanged with the pre-polish fifth semiconductor wafer 75. After the exchange, the platen 24 starts to polish the fifth semiconductor wafer 75. At time t8 that is three minutes after time t3, the platen 25 finishes polishing the third semiconductor wafer 73 for the first time. During the ten seconds between time t8 and time t9, the third semiconductor wafer 73, which has already been polished once on the platen 25, is exchanged with the pre-polish sixth semiconductor wafer 76. After the exchange, the platen 25 starts to polish the sixth semiconductor wafer 76.

After this, the above-described process is repeated. In accordance with the following equation (4), the throughput of this CMP apparatus turns out to be 56.8 semiconductor wafers per hour, which is a high throughput value.

$$\{3600/(180+10)\} \times 3 = 56.8 \tag{4}$$

Figure 11B:
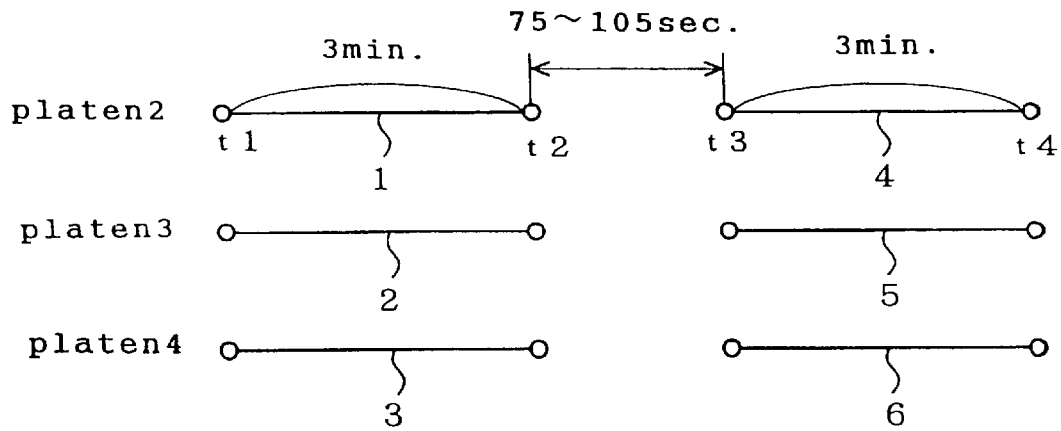
FIG. 11B is a time chart of an operation mode in which the conventional CMP apparatus polishes semiconductor wafers simultaneously for the first time.

FIG. 11B shows the progress of the polish process of the afore-discussed conventional CMP apparatus during the operation in the batch mode (see FIGS. 3 and 4)

In this conventional CMP apparatus, the carousel 9 supports the four carriers 10, 11, 12, and 13 as a whole. The positions of the semiconductor wafers held in the carriers 10 through 13 are determined when the carousel 9 rotates by a prescribed angle. Hence, once the carriers 10, 11, and 12 press the first, second, and third semiconductor wafers onto the polish pads that are glued to the platens 2, 3, and 4, respectively, and the semiconductor wafers start to be polished, the carousel 9 cannot be rotated. Thus, a new pre-polish semiconductor wafer on the load-and- unload station 5 cannot be moved to another platen by rotating the carousel 9 until the polishing operation is completed.

Thus, in this conventional CMP apparatus, the polishing operation cannot be started until the first through third semiconductor wafers are moved onto the platens 2, 3, and 4, respectively. The conventional CMP apparatus starts to polish all the three semiconductor wafers simultaneously at time t1, and completes the polish simultaneously three minutes later at time t2. While the three semiconductor wafers are being polished, the remaining carrier 13 picks up the fourth pre-polish semiconductor wafer from the load-and-unload station 5. After the first, second, and third semiconductor wafers are polished, during the time interval between time t2 and time t3 (75–105 seconds), the carriers 10 and 11 sequentially pick up and hold the fifth and sixth semiconductor wafers, respectively, from the load-and-unload station 5. The fourth through sixth semiconductor wafers are then placed onto the platens 2 through 4, respectively.

Next, the fourth through sixth semiconductor wafers are simultaneously polished for three minutes between time t3 and time t4. After this, the above-described process is repeated. As a result, the throughput of the conventional CMP apparatus ranges from 37.9 semiconductor wafers per hour to 42.4 semiconductor wafers per hour, which is low.

When the conventional CMP apparatus operates in the in-line mode (see FIG. 2), the stability and re-producibility of the polish characteristics deteriorate. However, the CMP apparatus according to the present embodiment has a high throughput value as has been stated before, and the polish characteristics of the CMP apparatus are very stable since each of the platens executes the first polish to the end without splitting the first polish among several platens.

Next, an operation mode of the CMP apparatus according to the present embodiment will be explained, in which the platens 23 and 24 perform the first polish and the platen 25 performs the second polish. In this case, a hard polish pad (IC1000) is glued to the surface of each of the platens 23 and 24, and a soft polish pad (SUPREME) is glued to the surface of the platen 25.

First, the robot 29 takes out a first pre-polish semiconductor wafer 81 from the wafer cassette 28. Then as shown in FIG. 12A, the first semiconductor wafer 81 is placed on the cup 26 that is installed on the index table 22. Next, the control apparatus rotates the index table 22 counterclockwise by 90 degrees. As shown in FIG. 12B, this causes the first semiconductor wafer 81 to be moved to a position near the platen 23. Then, the carrier 46 descends onto the first semiconductor wafer 81, and adsorbs and holds the back surface (substrate side) of the first semiconductor wafer 81.

In this case, the dresser 30 moves onto the platen 23. As the platen 23 rotates, the dresser 30 conditions the polish pad that is glued on the platen 23. Next, as shown in FIG. 12C, the dresser 30 returns to its original position. Subsequently, the carrier 46 carries the first semiconductor wafer 81 from the index table 22 onto the platen 23. As a result, the device formation surface of the first semiconductor wafer 81 faces the surface of the platen 23.

After this, the carrier 46 rotates and descends onto the polish pad of the platen 23. Then the polish pad of the rotating platen 23 presses the device formation surface of the first semiconductor wafer 81 with a prescribed pressure. At the same time, a slurry is supplied onto the device formation surface of the first semiconductor wafer 81. In this way, the first semiconductor wafer 81 is chemical-mechanically polished.

While the platen 23 is chemical-mechanically polishing the first semiconductor wafer 71, the index table 22 is rotated counterclockwise by 90 degrees. Then, as shown in FIG. 12D, the robot 29 picks up a second semiconductor wafer 82 from the wafer cassette 28, and places the second semiconductor wafer 82 onto the cup 27. After this, the index table 22 is rotated counterclockwise by 180 degrees. Then, as shown in FIG. 12E, the second semiconductor wafer 82 is moved to a position near the platen 24.

In this case, the dresser 31 moves onto the platen 24. When the platen 24 rotates, the dresser 31 conditions the polish pad glued to the platen 24. Next, as shown in FIG. 12F, the dresser 31 is returned to its original position. Subsequently, the carrier 47 moves the second semiconductor wafer 82 from the index table 22 onto the platen 24. As a result, the device formation surface of the second semiconductor wafer 82 faces the surface of the platen 24. After this, the carrier 47 rotates and descends onto the polish pad of the rotating platen 24. Then the device formation surface of the second semiconductor wafer 82 is pressed onto the polish pad of the rotating platen 24 with a prescribed pressure. At the same time, the slurry is supplied to the polish pad. In this way, the second semiconductor wafer 82 is chemical-mechanically polished.

Figure 12G:
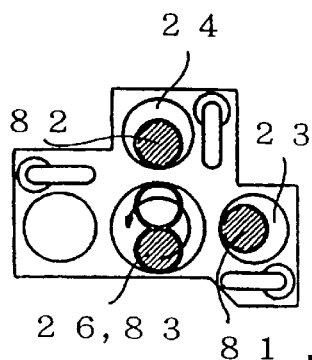
FIGS. 12A through 12G are top view drawings showing the first process flow in an operation mode in which the CMP apparatus according to the present embodiment polishes some semiconductor wafers for the first time and some other semiconductor wafers for the second time in parallel.
Figure 12D:
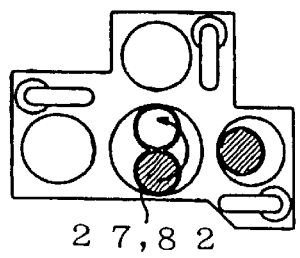
Figure 12A:
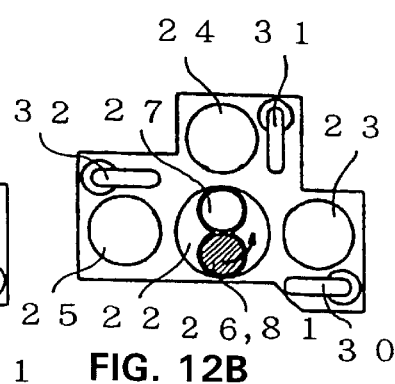
Figure 12E:
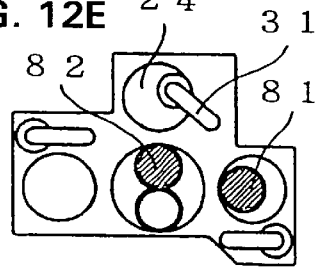
Figure 12B:
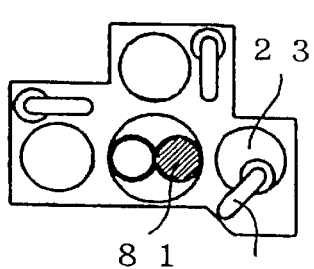
Figure 12F:
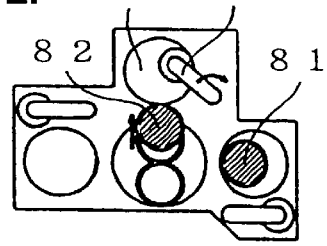
Figure 12C:
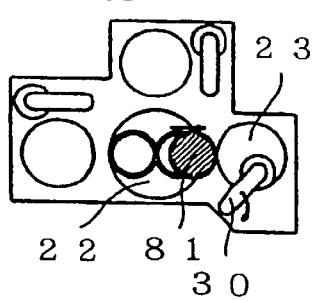

While the platens 23 and 24 are chemical-mechanically polishing the first and second semiconductor wafers 81 and 82, respectively, as shown in FIG. 12G, the robot 29 picks up a third semiconductor wafer 83 from the wafer cassette 28, and places the third semiconductor wafer 83 onto the cup 26. After this, the index table 22 is rotated counterclockwise by 270 degrees. Then, as shown in FIG. 13H, the empty cup 27 is moved to a position near the platen 23.

Figure 13P:
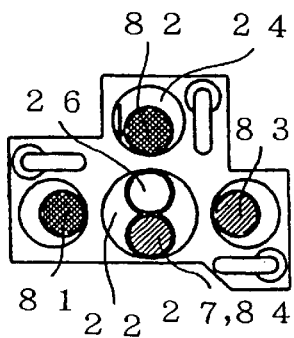
FIGS. 13H through 13S are top view drawings showing the second process flow in an operation mode in which the CMP apparatus according to the present embodiment polishes some semiconductor wafers for the first time and some other semiconductor wafers for the second time in parallel.
Figure 13L:
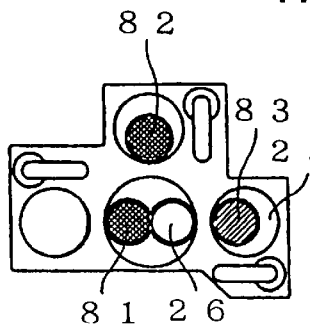
Figure 13H:
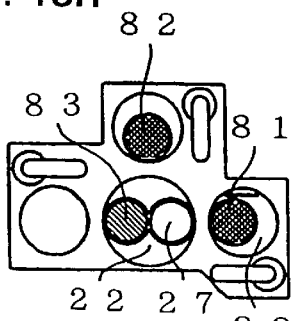
Figure 13Q:
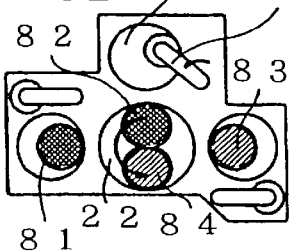

At this stage, the first semiconductor wafer 81 placed on the platen 23 has been polished for three minutes for the first time. The carrier 46 then moves the first semiconductor wafer 81 onto the empty cup 27. FIG. 13I shows this state. After this, the index table 22 is rotated counterclockwise by 180 degrees. Then, as shown in FIG. 13J, the post-polish first semiconductor wafer 81 is moved to the neighborhood of the empty platen 25. At the same time, the dresser 30 moves onto the platen 23. When the platen 23 rotates, the dresser 30 conditions the polish pad glued to the platen 23.

Figure 13M:
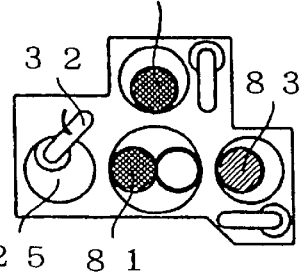
Figure 13I:
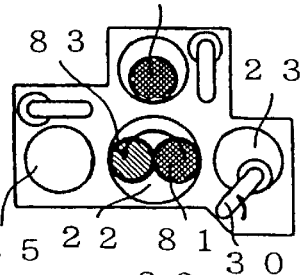
Figure 13R:
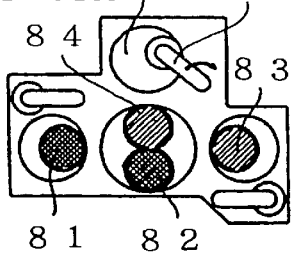
Figure 13N:
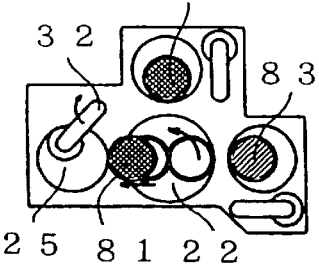
Figure 13J:
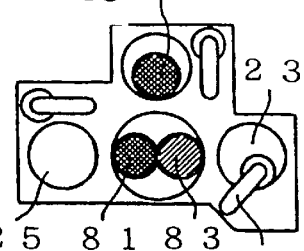
Figure 13S:
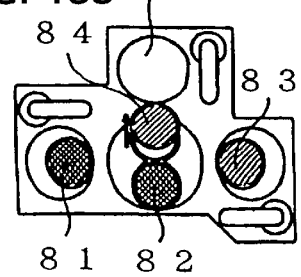
Figure 13O:
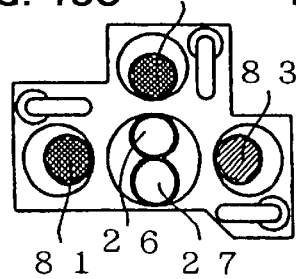
Figure 13K:
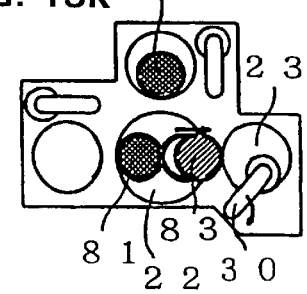

Next, as shown in FIG. 13K, the dresser 30 is returned to its original position. Subsequently, the carrier 46 moves the third semiconductor wafer 83 from the index table 22 onto the platen 23. As a result, the device formation surface of the third semiconductor wafer 83 faces the surface of the platen 23 as shown in FIG. 13L. After this, the carrier 46 rotates and descends onto the polish pad of the rotating platen 23. Then the device formation surface of the third semiconductor wafer 83 is pressed onto the polish pad of the rotating platen 23 with a prescribed pressure. At the same time, the slurry is supplied to the polish pad. In this way, the third semiconductor wafer 83 is chemical-mechanically polished.

Next, as shown in FIG. 13M, the dresser 32 moves onto the platen 25. When the platen 25 rotates, the dresser 32 conditions the polish pad for the second polish glued to the platen 25. Next, as shown in FIG. 13N, the dresser 32 is returned to its original position. Subsequently, the carrier 48 moves the first semiconductor wafer 81 that has been polished once from the index table 22 onto the platen 25. The index table 22 is then rotated counterclockwise by 90 degrees. FIG. 13O shows this state.

At this stage, the carrier 48 descends onto the polish pad of the rotating platen 25. Then the device formation surface of the first semiconductor wafer 81 is pressed onto the soft second-polish pad of the rotating platen 25 with a prescribed pressure. At the same time, the slurry is supplied to the polish pad. In this way, the first semiconductor wafer 81 is chemical-mechanically polished for the second time.

This second polish process is usually not intended to improve the degree of flatness of the surfaces of the semiconductor wafers. The second polish process is performed in order to enhance the coarse features of the polish surfaces of the semiconductor wafers or remove minute scratches formed on the polish surfaces of the semiconductor wafers during the first polish. Therefore, the time interval for the second polish process is usually set shorter than that for the first polish process. In the present embodiment, the first polish is performed for three minutes, and the second polish is completed in 40 seconds.

Next, as shown in FIG. 13P, the robot 29 picks up a fourth semiconductor wafer 84 from the wafer cassette 28, and places the fourth semiconductor wafer 84 onto the cup 27 installed on the index table 22. At this stage, the second semiconductor wafer 82 placed on the platen 24 has already been polished for three minutes for the first time. The carrier 47 then moves the second semiconductor wafer 82 onto the cup 26. FIG. 13Q shows this state. Then, the dresser 31 moves onto the platen 24. When the platen 24 rotates, the dresser 31 conditions the polish pad glued to the platen 24.

After this, the index table 22 is rotated counterclockwise by 180 degrees. Then, as shown in FIG. 13R, the pre-polish fourth semiconductor wafer 84 is moved to the neighborhood of the empty platen 24.

Figure 14X:
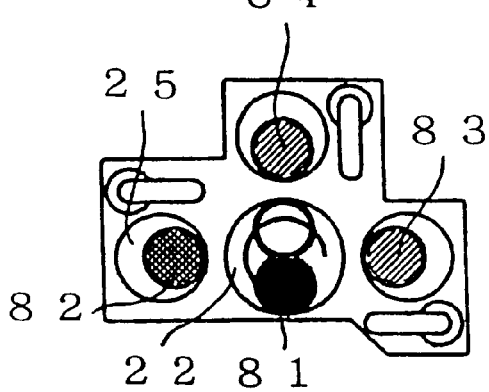
FIGS. 14T through 14Z are top view drawings showing the third process flow in an operation mode in which the CMP apparatus according to the present embodiment polishes some semiconductor wafers for the first time and some other semiconductor wafers for the second time in parallel.
Figure 14T:
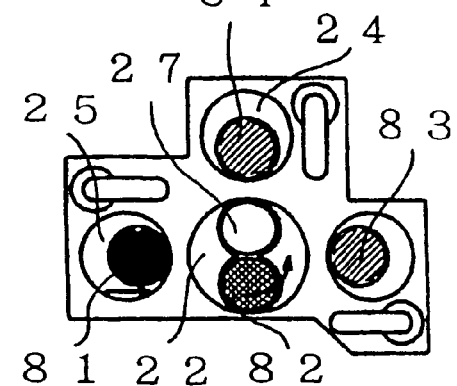

Next, the dresser 31 is returned to its original position. Subsequently, as shown in FIG. 13S, the carrier 47 moves the fourth semiconductor wafer 84 from the index table 22 onto the platen 24. Subsequently as shown in FIG. 14T, the device formation surface of the fourth semiconductor wafer 84 faces the surface of the platen 24. After this, the carrier 47 rotates and descends onto the polish pad of the rotating platen 24. Then the device formation surface of the fourth semiconductor wafer 84 is pressed onto the polish pad of the rotating platen 24 with a prescribed pressure. At the same time, the slurry is supplied to the polish pad. In this way, the fourth semiconductor wafer 84 is chemical-mechanically polished.

Figure 14Y:
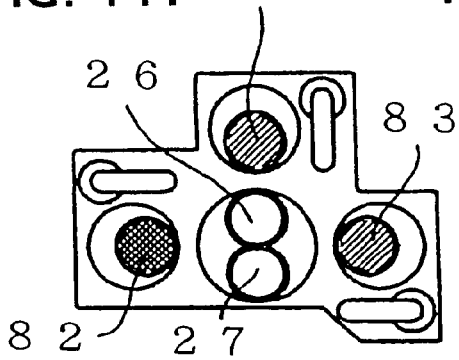
Figure 14U:
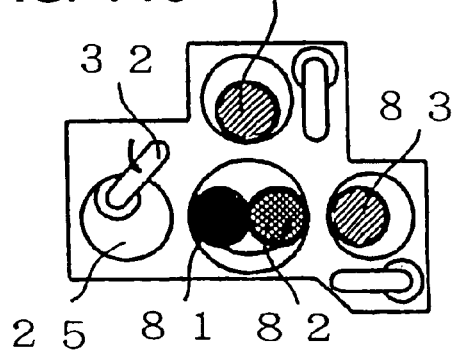
Figure 14Z:
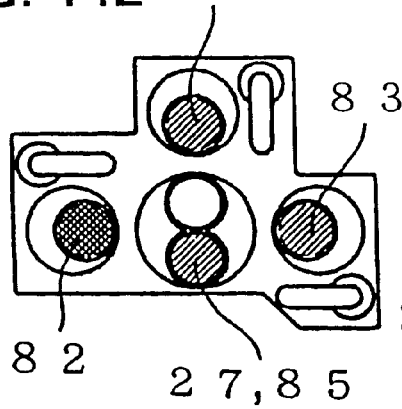

Next, the index table 22 is rotated counterclockwise by 90 degrees. As a result, the empty cup 27 is moved to the neighborhood of the platen 25. At this stage, the first semiconductor wafer 81 on the platen 25 has already been polished for the second time. The carrier 48 then moves the first semiconductor wafer 81 onto the cup 27 installed on the index table 22. FIG. 14U shows this state. Next, the dresser 32 moves onto the platen 25. When the platen 25 rotates, the dresser 32 conditions the polish pad glued to the platen 25.

Figure 14V:
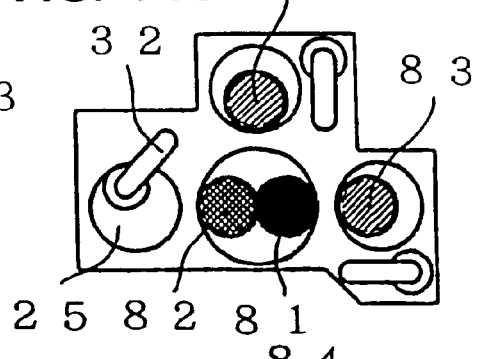
Figure 14W:
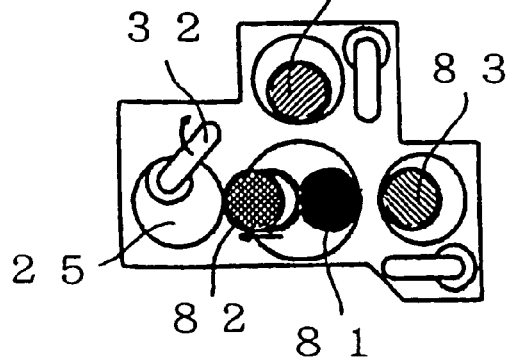

Next, the index table 22 is rotated counterclockwise by 180 degrees. At this stage, the second semiconductor wafer 82 has already been polished for the first time. Then, as shown in FIG. 14V, the second semiconductor wafer 82 is moved to the neighborhood of the platen 25. Next, as shown in FIG. 14W, the dresser 32 is returned to its original position. Subsequently, the carrier 48 moves the second semiconductor wafer 82 from the index table 22 onto the platen 25. FIG. 14X shows this state.

At this stage, the carrier 48 rotates and descends onto the polish pad of the rotating platen 25. Then the surface of the second semiconductor wafer 82 that has already been polished once is pressed with a prescribed pressure onto the soft second-polish pad glued to the platen 25. At the same time, the slurry is supplied to the surface of the second semiconductor wafer 82. In this way, the second semiconductor wafer 82 is chemical-mechanically polished for the second time. Next, the index table 22 is rotated counterclockwise by 270 degrees. At this stage, the first semiconductor wafer 81 has already been polished twice. Then the robot 29 picks up the first semiconductor wafer 81 and stores the first semiconductor wafer 81 into the wafer cassette 28. As a result, the cups 26 and 27 on the index table 22 become empty as shown in FIG. 14Y.

Next, the robot 29 supplies a fifth pre-polish fifth semiconductor wafer 85 onto the cup 27. After this, the above-explained process is repeated.

Figure 15A:
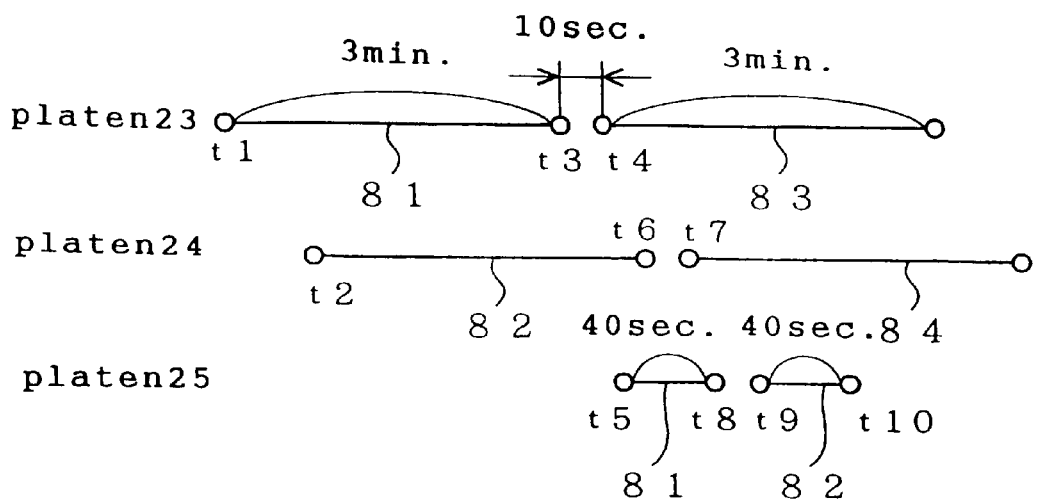
FIG. 15A is a time chart of the operation mode in which the CMP apparatus according to the present embodiment polishes some semiconductor wafers for the first time and some other semiconductor wafers for the second time in parallel.

In the CMP apparatus according to the present embodiment, sequentially in parallel as shown in FIG. 15A, the two platens 23 and 24 polish two semiconductor wafers for the first time, and the platen 25 polishes one semiconductor wafer for the second time.

Specifically, the platen 23 starts to polish the first semiconductor wafer 81 for the first time at time t1. Subsequently, the platen 24 starts to polish the second semiconductor wafers 82 for the first time at time t2. The platen 23 polishes the first semiconductor wafer 81 for three minutes for the first time. At time t3 that is three minutes after time t1, the first polish of the first semiconductor wafer 81 is completed. During the ten seconds between time t3 and time t4, the first semiconductor wafer 81, which has already been polished once on the platen 23, is exchanged with the pre-polish third semiconductor wafer 83. After the exchange, the platen 23 starts to polish the third semiconductor wafer 83 for the first time.

Subsequently at time t5, the first semiconductor wafer 81, which has already been polished once, is moved to the platen 25, and the platen 25 starts to polish the first semiconductor wafer 81 for the second time. Subsequently at time t6, that is three minutes after time t2, the platen 24 finishes polishing the second semiconductor wafer 82 for the first time. During the ten seconds between time t6 and time t7, the second semiconductor wafer 82 is exchanged with the pre-polish fourth semiconductor wafer 84. After the exchange, the platen 24 starts to polish the fourth semiconductor wafer 84 for the first time. At time t8 that is 40 seconds after time t5, the platen 25 finishes polishing the first semiconductor wafer 81 for the second time. During the ten seconds between time t8 and time t9, the first semiconductor wafer 81 on the platen 25 is exchanged with the second semiconductor wafer 82, which has been polished once. After the exchange, the platen 25 polishes the second semiconductor wafer 82 for the second time for 40 seconds, and finishes the second polish at time t10.

After this, the above-described process is repeated. In accordance with the following equation (5), the throughput of the CMP apparatus turns out to be 37.9 semiconductor wafers per hour.

$$\{3600/(180+10)\} \times 2 = 37.9 \tag{5}$$

Figure 15B:
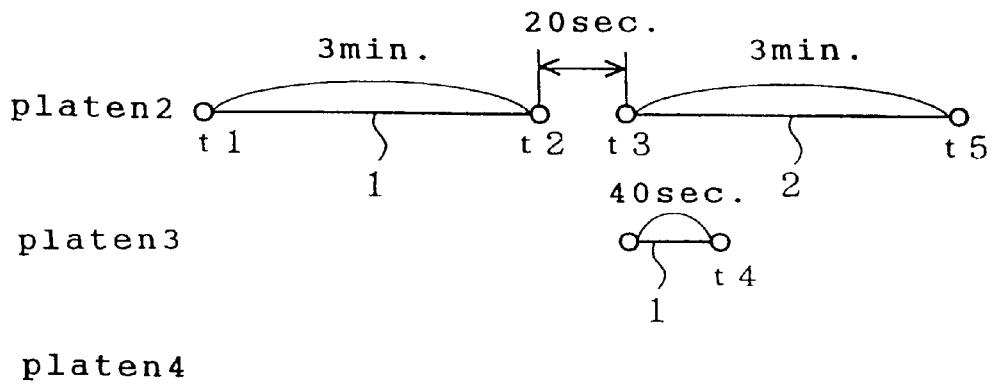
FIG. 15B is a time chart of an operation mode in which the conventional CMP apparatus polishes some semiconductor wafers for the first time and some other semiconductor wafers for the second time in parallel.

FIG. 15B shows the progress of the process in which the afore-explained conventional CMP apparatus performs the first-polish and second-polish operations in parallel.

In this conventional CMP apparatus, the carousel 9 supports the four carriers 10, 11, 12, and 13 as a whole, and the positions of the semiconductor wafers held in the carriers 10 through 13 are indicated when the carousel 9 rotates by a prescribed angle. Therefore, the carousel 9 cannot be used to indicate the positions of the semiconductor wafers held in the carriers 10 through 13 while one of the platens 2 through 4 is polishing a semiconductor wafer. Hence, the afore-explained conventional CMP apparatus cannot perform the first polish simultaneously using two platens even though the afore-explained conventional CMP apparatus has three platens, the same number of platens as the CMP apparatus according to the present embodiment.

Specifically, suppose as in the present embodiment that a hard first- polish pad is glued to each of the platens 2 and 3, a soft second-polish pad is glued to the platen 4, and the platens 2 and 3 polish the first and second semiconductor wafers held by the carriers 10 and 11, respectively, simultaneously in parallel for the first time. In this case, when the carousel 9 rotates in the next step, the first semiconductor wafer the carrier 10 is holding is moved onto the platen 4 to which the soft second-polish pad is glued. However, the second semiconductor wafer the carrier 11 is holding is moved onto the platen 3 to which the hard first-polish pad is glued. Therefore, the first-polish is performed for the second semiconductor wafer again.

Hence, in the case in which the conventional CMP apparatus performs the first-polish and second-polish in parallel, the two platens 2 and 3 are used as shown in FIG. 15B, and the platen 4 remains unused. In this configuration, the carousel 9 moves first the first semiconductor wafer, which the carrier 10 holds, onto the platen 2. Then the hard first-polish pad glued to the platen 2 polishes the first semiconductor wafer for three minutes between time t1 and time t2 for the first time. During this time interval, the carrier 11 picks up and holds the second semiconductor wafer from the load-and-unload station 5.

Next, during the 20 seconds between time t2 and t3, the carousel 9 rotates so as to indicate the rotation positions for the first and second semiconductor wafers, respectively. As a result, the first semiconductor wafer is moved onto the soft second-polish pad glued to the platen 3, and the second semiconductor wafer is moved onto the platen 2. After this, the carriers 10 and 11 descend onto the platens 3 and 2, respectively. At time t3, the platen 3 starts to polish the first semiconductor wafer for the second time using the soft second-polish pad. At the same time, the platen 2 starts to polish the second semiconductor wafer for the first time. The platen 3 polishes the first semiconductor wafer for the second time for 40 seconds, and completes the second polish at time t4. The platen 2 polishes the second semiconductor wafer for the first time for three minutes and completes the first-polish at time t5.

After this, the above-described process is repeated. In accordance with the following equation (6), the throughput of the conventional CMP apparatus turns out to be eighteen semiconductor wafers per hour.

$$\{3600/(180+20)\}=18 \tag{6}$$

Both in the conventional CMP apparatus and the CMP apparatus according to the present embodiment that performs the first-polish and second-polish operations in parallel in the above-described manner, the first and second polish operations are not performed by work-splitting. Therefore, unlike the case of the afore-described split polish, the polish characteristics of both the conventional CMP apparatus and the CMP apparatus according to the present embodiment remain stable. However, as equations (5) and (6) show, the throughput of the CMP apparatus according to the present embodiment is more than twice as high as that of the conventional CMP apparatus. In other words, the CMP apparatus according to the present embodiment has an extremely high productivity in addition to stable polish characteristics.

Two operation modes of the CMP apparatus according to the present embodiment have been explained. In the first operation mode, a polish pad of the same type is glued to each of the platens 23 through 25, and multiple semiconductor wafers are polished simultaneously for the first time. In the second operation mode, a hard first-polish pad is glued to each of the platens 23 and 24, and a soft second-polish pad is glued to the platen 25. The first-polish and second-polish operations are then performed in parallel. However, the performance of the CMP apparatus according to the present embodiment is not restricted to these two operation modes. For example, a polish pad of the same type may be glued to each of the platens 23 through 25. In this case, a hard-polish slurry for the first- polish is supplied to the platens 23 and 24, and a soft-polish slurry for the second-polish is supplied to the platen 25. In this way, the first and second polish operations can be performed in parallel. In this alternative operation mode also, the same effects can be achieved as in the above-described present embodiment.

Although the present invention has been explained in reference to the embodiment, it is apparent for those skilled in the art that many changes and modifications can be made without departing from the spirit and scope of the invention, as clear from the following claims.

What is claimed is:

1. A semiconductor wafer surface flattening apparatus having a surface plate including a surface for holding a polish pad, a carrier for holding and carrying a semiconductor wafer, the carrier pressing with a prescribed pressure on a surface of the semiconductor wafer onto the corresponding polish pad, and a control apparatus for controlling an operation of the carrier, for mechanically polishing the surface of the semiconductor wafer using the polish pad, and simultaneously chemically polishing the surface of the semiconductor wafer by supplying a polish liquid to the corresponding polish pad, comprising:

an index table for receiving a plurality of said semiconductor wafers, and indicating a position for each of the plurality of semiconductor wafers when the index table rotates;

wherein:

a plurality of said surface plates are installed around the index table;

a carrier is installed for each of the plurality of surface plates so as to transport a semiconductor wafer between the index table and each of the surface plates; and the control apparatus controls a rotation angle of the index table and operations of the plurality of carriers.

2. A semiconductor wafer surface flattening apparatus as claimed in claim 1, wherein the control apparatus polishes the plurality of semiconductor wafers in parallel by a process comprising the steps of:

controlling the rotation of the index table so as to move a pre-polish semiconductor wafer, which is supplied to the index table, to a position near a first one of the plurality of surface plates;

moving the pre-polish semiconductor wafer from the index table onto a first surface plate using a first of the plurality of carriers;

starting polishing the pre-polish semiconductor wafer;

supplying a new pre-polish semiconductor wafer onto the index table;

controlling the rotation of the index table so as to move the new pre-polish semiconductor wafer to a position near a second one of the plurality of surface plates;

moving the new pre-polish semiconductor wafer from the index table onto a second surface plate using a second carrier; and starting polishing the new pre-polish semiconductor wafer.

3. A semiconductor wafer surface flattening apparatus as claimed in claim 2, wherein the control apparatus:

finishes polishing the semiconductor wafer on the first surface plate;

moves a post-polish semiconductor wafer from the first surface plate onto the index table using the first carrier;

controls the rotation of the index table so as to move a new pre-polish semiconductor wafer, which is supplied onto the index table, to a position near the first surface plate;

moves the pre-polish semiconductor wafer from the index table onto the first surface plate using the first carrier;

starts polishing the pre-polish semiconductor wafer on the first surface plate;

finishes polishing the semiconductor wafer on the second surface plate;

moves the post-polish semiconductor wafer from the second surface plate onto the index table using the second carrier;

supplies a new pre-polish semiconductor wafer onto the index table;

controls the rotation of the index table so as to move the pre-polish semiconductor wafer to a position near the second surface plate;

moves the pre-polish semiconductor wafer from the index table onto the second surface plate using the second carrier; and starts polishing the pre-polish semiconductor wafer on the second surface plate, polishing the plurality of semiconductor wafers in parallel.

4. A semiconductor wafer surface flattening apparatus as claimed in claim 3, further comprising a dresser for polishing the polish pad, a dresser being installed for each of the surface plates, and the dresser polishes the polish pad on the surface plate before the carrier moves the semiconductor wafer onto the surface plate.

5. A semiconductor wafer surface flattening apparatus as claimed in claim 3, wherein all the polish pads installed on the surface plates are first-polish pads for performing an initial polishing of the semiconductor wafers and the initial polishing of the semiconductor wafers is performed on the respective surface plates in parallel.

6. A semiconductor wafer surface flattening apparatus as claimed in claim 3, wherein the polish pads installed on the surface plates are classified into two types, first-polish pads for performing an initial polishing of the semiconductor wafers and second-polish pads for performing a second polishing of the semiconductor wafers, and the initial polishing and the second polishing of the semiconductor wafers are performed in parallel on the surface plates.

7. A semiconductor wafer surface flattening apparatus as claimed in claim 6, wherein the number of the surface plates and the number of the carriers are both three, a first-polish pad being installed on each of the first and second surface plates, a second-polish pad being installed on the third surface plate, and the control apparatus:

controls the rotation of the index table so as to move a new pre-polish semiconductor wafer, which is supplied onto the index table, to a position near the first surface plate, moves the pre-polish semiconductor wafer from the index table onto the first surface plate using the first carrier, and starts polishing the pre-polish semiconductor wafer on the first surface plate for the first time;

controls the rotation of the index table so as to move a new pre-polish semiconductor wafer, which is supplied onto the index table, to a position near the second surface plate when the semiconductor wafer has been moved from the index table onto the first surface plate, and moves the pre-polish semiconductor wafer from the index table onto the second surface plate using the second carrier, and starts polishing the pre-polish semiconductor wafer on the second surface plate for the first time;

moves the semiconductor wafer on the first surface plate onto the index table using the first carrier when the semiconductor wafer on the first surface plate has been polished for the first time, controls the rotation of the index table so as to move a pre-polish semiconductor wafer, which is supplied onto the index table, to a position near the first surface plate, moves the pre-polish semiconductor wafer from the index table onto the first surface plate using the first carrier, and starts polishing the pre-polish semiconductor wafer on the first surface plate for the first time;

controls the rotation of the index table so as to move the semiconductor wafer on the index table, which has been polished once, to a position near the third surface plate, moves this post-initial-polish semiconductor wafer from the index table onto the third surface plate using the third carrier, and starts polishing this post-initial-polish semiconductor wafer for the second time;

moves the semiconductor wafer on the second surface plate onto the index table using the second carrier when the semiconductor wafer on the second surface plate has been polished once, controls the rotation of the index table so as to move a new pre-polish semiconductor wafer, which is supplied to the index table, to a position near the second surface plate, moves this pre-polish semiconductor wafer from the index table onto the second surface plate using the second carrier, and starts polishing this pre-polish semiconductor wafer for the first time; and moves the semiconductor wafer on the third surface plate onto the index table using the third carrier when the semiconductor wafer on the third surface plate has been polished for the second time, controls the rotation of the index table so as to move the post-initial-polish semiconductor wafer on the index table to a position near the third surface plate, moves this post-initial-polish semiconductor wafer on the index table onto the third surface plate using the third carrier, and starts polishing this post-initial-polish semiconductor wafer for the second time, polishing two semiconductor wafers for the first time and one semiconductor wafer for the second time in parallel.

8. A semiconductor wafer surface flattening apparatus as claimed in claim 7, further comprising a corresponding dresser for polishing each of the corresponding polish pads, wherein the corresponding dresser polishes the corresponding polish pad installed on the corresponding surface plate before the carrier moves the semiconductor wafer onto the surface plate.

9. A semiconductor wafer surface flattening apparatus as claimed in claim 8, further comprising two cups that are installed on the index table, wherein a robot picks up a pre-polish semiconductor wafer from a wafer cassette, loads the pre-polish semiconductor wafer onto one of the two cups, and unloads the semiconductor wafer from the cup after the semiconductor wafer has been polished.

10. A semiconductor wafer surface flattening apparatus as claimed in claim 9, further comprising an air cylinder forming the carrier up and down, and the carrier is guided by a ball screw that is rotated by a driving force of a motor, and moves between the surface plate and the index table.

11. A semiconductor wafer surface flattening apparatus as claimed in claim 10, wherein the carrier adsorbs a back surface of a semiconductor wafer and holds the semiconductor wafer when a pump vacuums air.

12. A semiconductor wafer surface flattening apparatus as claimed in claim 2, wherein the number of the surface plates and the number of the carriers are both three and the control apparatus:

controls the rotation of the index table so as to move a new pre-polish semiconductor wafer, which is supplied onto the index table, to a position near the first surface plate, moves the pre-polish semiconductor wafer from the index table onto the first surface plate using the first carrier, and starts polishing the pre-polish semiconductor wafer;

controls the rotation of the index table so as to move a new pre-polish semiconductor wafer, which is supplied onto the index table, to a position near the second surface plate when the semiconductor wafer has been moved from the index table onto the first surface plate, moves this pre-polish semiconductor wafer from the index table onto the second surface plate using the second carrier, and starts polishing this pre-polish semiconductor wafer;

controls the rotation of the index table so as to move a new pre-polish semiconductor wafer, which is supplied onto the index table, to a position near the third surface plate when the semiconductor wafer has been moved from the index table onto the second surface plate, moves this pre-polish semiconductor wafer from the index table onto the third surface plate using the third carrier, and starts polishing this pre-polish semiconductor wafer;

moves the semiconductor wafer from the first surface plate onto the index table using the first carrier when the semiconductor wafer on the first surface plate has been polished, controls the rotation of the index table so as to move a new pre-polish semiconductor wafer, which is supplied onto the index table, to a position near the first surface plate, moves this pre-polish semiconductor wafer from the index table onto the first surface plate using the first carrier, and starts polishing this pre-polish semiconductor wafer;

moves the semiconductor wafer from the second surface plate onto the index table using the second carrier when the semiconductor wafer on the second surface plate has been polished, controls the rotation of the index table so as to move a new pre-polish semiconductor wafer, which is supplied onto the index table, to a position near the second surface plate, moves this pre-polish semiconductor wafer from the index table onto the second surface plate using the second carrier, and starts polishing this pre-polish semiconductor wafer; and moves the semiconductor wafer from the third surface plate onto the index table using the third carrier when the semiconductor wafer on the third surface plate has been polished, controls the rotation of the index table so as to move a new pre-polish semiconductor wafer, which is supplied onto the index table, to a position near the third surface plate, moves this pre-polish semiconductor wafer from the index table onto the third surface plate using the third carrier, and starts polishing this pre-polish semiconductor wafer, polishing three semiconductor wafers in parallel.

13. A semiconductor wafer surface flattening apparatus as claimed in claim 12, wherein a corresponding dresser polishes the corresponding polish pad installed on the corresponding surface plate before the carrier moves the semiconductor wafer onto the surface plate.

14. A semiconductor wafer surface flattening apparatus as claimed in claim 13, further comprising two cups that are installed on the index table, wherein a robot picks up a pre-polish semiconductor wafer from a wafer cassette, loads the pre-polish semiconductor wafer onto one of the two cups, and unloads the semiconductor wafer from the cup after the semiconductor wafer has been polished.

15. A semiconductor wafer surface flattening apparatus as claimed in claim 14, further comprising an air cylinder for moving the carrier up and down, and the carrier is guided by a ball screw that is rotated by a driving force of a motor, and moves between the surface plate and the index table.

16. A semiconductor wafer surface flattening apparatus as claimed in claim 15, wherein the carrier adsorbs a back surface of a semiconductor wafer and holds the semiconductor wafer when a pump vacuums air.

17. A semiconductor wafer surface flattening apparatus as claimed in claim 12, wherein all the polish pads installed on the surface plates are first-polish pads for performing an initial polishing of the semiconductor wafers and the initial polishing of the semiconductor wafer is performed on the respective surface plates in parallel.

* * * * *

UNITED STATES PATENT AND TRADEMARK OFFICE
CERTIFICATE OF CORRECTION

PATENT NO.   : 6 062 954
DATED        : May 16, 2000
INVENTOR     : Shigeto IZUMI It is certified that error appears in the above-identified patent and that said Letters Patent are hereby corrected as shown below:

Column 20,    line 41;    change "forming the carrier up and down" to ---for moving the carrier up and down---.

Signed and Sealed this

Tenth Day of April, 2001

Attest:

NICHOLAS P. GODICI

*Attesting Officer*    *Acting Director of the United States Patent and Trademark Office*